(12) United States Patent
Saito et al.

(10) Patent No.: US 11,264,272 B2
(45) Date of Patent: Mar. 1, 2022

(54) SEMICONDUCTOR DEVICE AND METHOD FOR MANUFACTURING THE SAME, AND ELECTRONIC APPARATUS

(71) Applicant: SONY SEMICONDUCTOR SOLUTIONS CORPORATION, Kanagawa (JP)

(72) Inventors: Suguru Saito, Kanagawa (JP); Nobutoshi Fujii, Kanagawa (JP); Masaki Haneda, Kanagawa (JP); Kazunori Nagahata, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/959,723

(22) PCT Filed: Dec. 28, 2018

(86) PCT No.: PCT/JP2018/048419
§ 371 (c)(1),
(2) Date: Jul. 2, 2020

(87) PCT Pub. No.: WO2019/138924
PCT Pub. Date: Jul. 18, 2019

(65) Prior Publication Data
US 2020/0350198 A1 Nov. 5, 2020

(30) Foreign Application Priority Data
Jan. 11, 2018 (JP) .............................. JP2018-002368

(51) Int. Cl.
*H01L 21/768* (2006.01)
*H01L 23/522* (2006.01)
(Continued)

(52) U.S. Cl.
CPC .... *H01L 21/7682* (2013.01); *H01L 21/76831* (2013.01); *H01L 23/5226* (2013.01);
(Continued)

(58) Field of Classification Search
CPC ........... H01L 21/7682; H01L 21/76877; H01L 21/76802; H01L 21/76831; H01L 23/53295; H01L 23/5329
See application file for complete search history.

(56) References Cited

U.S. PATENT DOCUMENTS 9,892,961 B1 * 2/2018 Cheng ................. H01L 21/0217
2002/0048933 A1 4/2002 Brankner et al.
(Continued)

FOREIGN PATENT DOCUMENTS

CN 1514478 A 7/2004
EP 0924760 A2 6/1999
(Continued)

OTHER PUBLICATIONS

Google patents translation of Fujitsu Ltd JP05-21617A (Year: 1993).*
(Continued)

*Primary Examiner* — Zandra V Smith
*Assistant Examiner* — John M Parker
(74) *Attorney, Agent, or Firm* — Chip Law Group

(57) ABSTRACT

The present technology relates to Provided are a semiconductor device in which an air gap structure can be formed in any desired region regardless of the layout of metallic wiring lines, a method for manufacturing the semiconductor device, and an electronic apparatus. A first wiring layer and a second wiring layer including a metallic film are stacked via a diffusion preventing film that prevents diffusion of the metallic film. The diffusion preventing film is formed by burying a second film in a large number of holes formed in
(Continued)

a first film. At least the first wiring layer includes the metallic film, an air gap, and a protective film formed with the second film on the inner peripheral surface of the air gap, and the opening width of the air gap is equal to the opening width of the holes formed in the first film or is greater than the opening width of the holes.

13 Claims, 23 Drawing Sheets

(51) Int. Cl.
    *H01L 23/528*     (2006.01)
    *H01L 23/532*     (2006.01)
    *H01L 27/146*     (2006.01)

(52) U.S. Cl.
    CPC .... *H01L 23/5283* (2013.01); *H01L 23/53295* (2013.01); *H01L 27/14636* (2013.01)

(56) References Cited

U.S. PATENT DOCUMENTS

| | | | |
|---|---|---|---|
| 2004/0127001 A1 | 7/2004 | Colburn et al. | |
| 2009/0263951 A1* | 10/2009 | Shibata | H01L 21/76816 438/422 |
| 2009/0309230 A1 | 12/2009 | Cui et al. | |
| 2016/0240428 A1* | 8/2016 | Tung | H01L 21/76843 |

FOREIGN PATENT DOCUMENTS

| | | |
|---|---|---|
| JP | 05-021617 A | 1/1993 |
| JP | 11-026575 A | 1/1999 |
| JP | 11-243145 A | 9/1999 |
| JP | 2004-072018 A | 3/2004 |
| JP | 2004-214648 A | 7/2004 |
| JP | 2009-302545 A | 12/2009 |
| KR | 10-2009-0130836 A | 12/2009 |
| TW | 200426947 A | 12/2004 |
| TW | 201011863 A | 3/2010 |

OTHER PUBLICATIONS

Fischer, et al., "Low-K Interconnect Stack With Multi-Layer Air Gap And Tri-Metal-Insulator-Metal Capacitors for 14nm High Volume Manufacturing", Intel Corporation, IEEE International Interconnect Technology Conference and 2015 IEEE Materials for Advanced Metallization Conference (IITC/MAM), 2015, pp. 5-8.
International Search Report and Written Opinion of PCT Application No. PCT/JP2018/048419, dated Feb. 12, 2019, 10 pages of ISRWO.

* cited by examiner

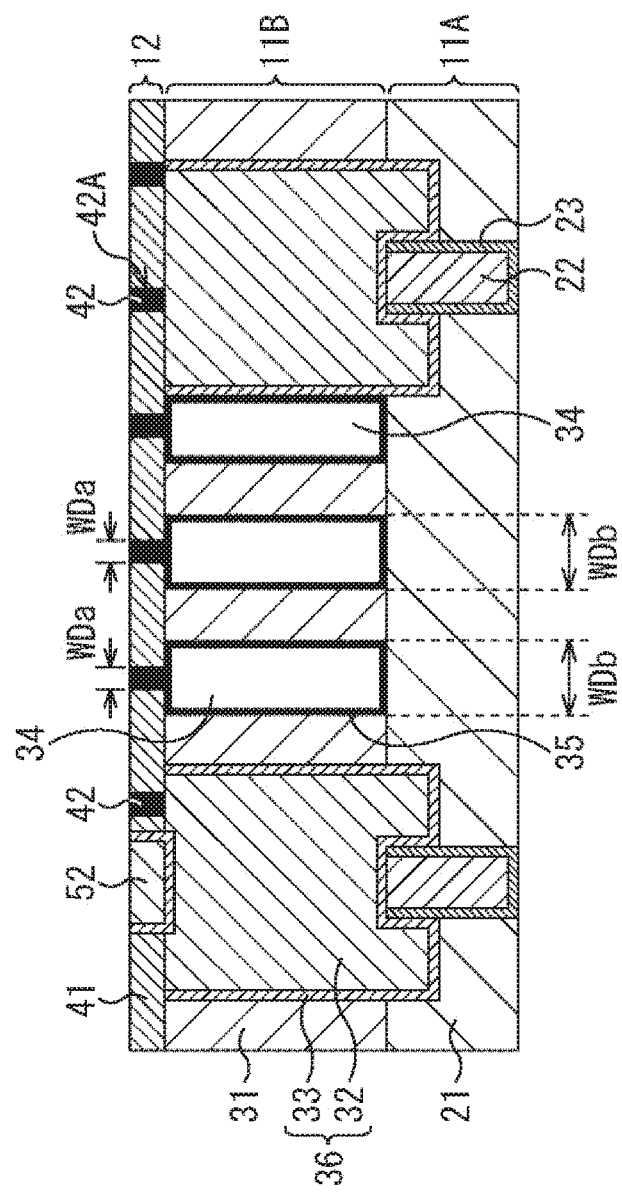

SEMICONDUCTOR DEVICE AND METHOD FOR MANUFACTURING THE SAME, AND ELECTRONIC APPARATUS

CROSS REFERENCE TO RELATED APPLICATIONS

This application is a U.S. National Phase of International Patent Application No. PCT/JP2018/048419 filed on Dec. 28, 2018, which claims priority benefit of Japanese Patent Application No. JP 2018-002368 filed in the Japan Patent Office on Jan. 11, 2018. Each of the above-referenced applications is hereby incorporated herein by reference in its entirety.

TECHNICAL FIELD

The present technology relates to a semiconductor device, a method for manufacturing the semiconductor device, and an electronic apparatus, and more particularly, to a semiconductor device in which an air gap structure can be formed in any desired region regardless of the layout of metallic wiring lines, a method for manufacturing the semiconductor device, and an electronic apparatus.

BACKGROUND ART

There is a suggested structure in which air gaps are formed in insulating layer portions interposed between metallic wiring lines, to reduce the wiring capacitance in the back-end-of-line (BEOL) region (see Non-Patent Document 1, for example).

CITATION LIST

Non-Patent Document

Non-Patent Document 1: IEEE 2015 International Interconnect Technology Conference Low-k Interconnect Stack with Multi-Layer Air Gap and Tri-Metal-Insulator-Metal Capacitors for 14 nm High Volume Manufacturing, Intel Corporation

SUMMARY OF THE INVENTION

Problems to be Solved by the Invention

In a structure in which air gaps are formed in insulating layer portions interposed between metallic wiring lines, air gaps cannot be formed in a region having no metallic wiring lines formed therein, and the region in which air gaps are formed is limited.

The present technology has been made in view of such circumstances, and is to enable formation of an air gap structure in any desired region regardless of the layout of metallic wiring lines.

Solutions to Problems

In a semiconductor device according to a first aspect of the present technology, a first wiring layer and a second wiring layer including a metallic film are stacked via a diffusion preventing film that prevents diffusion of the metallic film, the diffusion preventing film includes a first film and a second film buried in a large number of holes formed in the first film, at least the first wiring layer includes the metallic film, an air gap, and a protective film formed with the second film on the inner peripheral surface of the air gap, and the opening width of the air gap is equal to the opening width of the holes formed in the first film or is greater than the opening width of the holes.

A method for manufacturing a semiconductor device according to a second aspect of the present technology includes: forming a first film on the upper surface of a wiring layer in which a metallic film is formed, the first film serving as a diffusion preventing film that prevents diffusion of the metallic film; forming a large number of holes in the first film; forming an air gap in the wiring layer below the large number of holes, the air gap having a greater opening width than the opening width of the holes; and forming a second film on the inner peripheral surface of the air gap, and burying the second film in the large number of holes.

In the second aspect of the present technology, a first film that serves as a diffusion preventing film that prevents diffusion of a metallic film is formed on the upper surface of a wiring layer in which the metallic film is formed, a large number of holes are formed in the first film, an air gap having a greater opening width than the opening width of the holes is formed in the wiring layer below the large number of holes, and a second film is formed on the inner peripheral surface of the air gap and is buried in the large number of holes.

An electronic apparatus according to a third aspect of the present technology includes a semiconductor device in which a first wiring layer and a second wiring layer including a metallic film are stacked via a diffusion preventing film that prevents diffusion of the metallic film, the diffusion preventing film includes a first film and a second film buried in a large number of holes formed in the first film, at least the first wiring layer includes an air gap, and a protective film formed with the second film on the inner peripheral surface of the air gap, and the opening width of the air gap is equal to the opening width of the holes formed in the first film or is greater than the opening width of the holes.

In the first and third aspects of the present technology, a first wiring layer and a second wiring layer including a metallic film are stacked via a diffusion preventing film that prevents diffusion of the metallic film, the diffusion preventing film includes a first film and a second film buried in a large number of holes formed in the first film, at least the first wiring layer includes the metallic film, an air gap, and a protective film formed with the second film on the inner peripheral surface of the air gap, and the opening width of the air gap is equal to the opening width of the holes formed in the first film or is greater than the opening width of the holes.

The semiconductor device and the electronic apparatus may be independent devices, or may be modules to be incorporated into other apparatuses.

Effects of the Invention

According to the first through third aspects of the present technology, an air gap structure can be formed in any desired region regardless of the layout of metallic wiring lines.

Note that effects of the present technology are not limited to the effects described herein, and may include any of the effects described in the present disclosure.

BRIEF DESCRIPTION OF DRAWINGS

FIG. 2 is a diagram for explaining a structure of air gaps.

MODES FOR CARRYING OUT THE INVENTION

The following is a description of modes (hereinafter referred to as embodiments) for carrying out the present technology. Note that explanation will be made in the following order.

1. First embodiment (an example basic configuration of a semiconductor device having air gaps)
2. Method for manufacturing the semiconductor device
3. Second embodiment (an example configuration of a semiconductor device having a plurality of layers of air gaps)
4. Third embodiment (an example configuration of a semiconductor device having air gaps only in part of the region)
5. Modifications
6. Example of application to a solid-state imaging device
7. Example application to an endoscopic surgery system
8. Example applications to moving objects

1. First Embodiment

Figure 1:
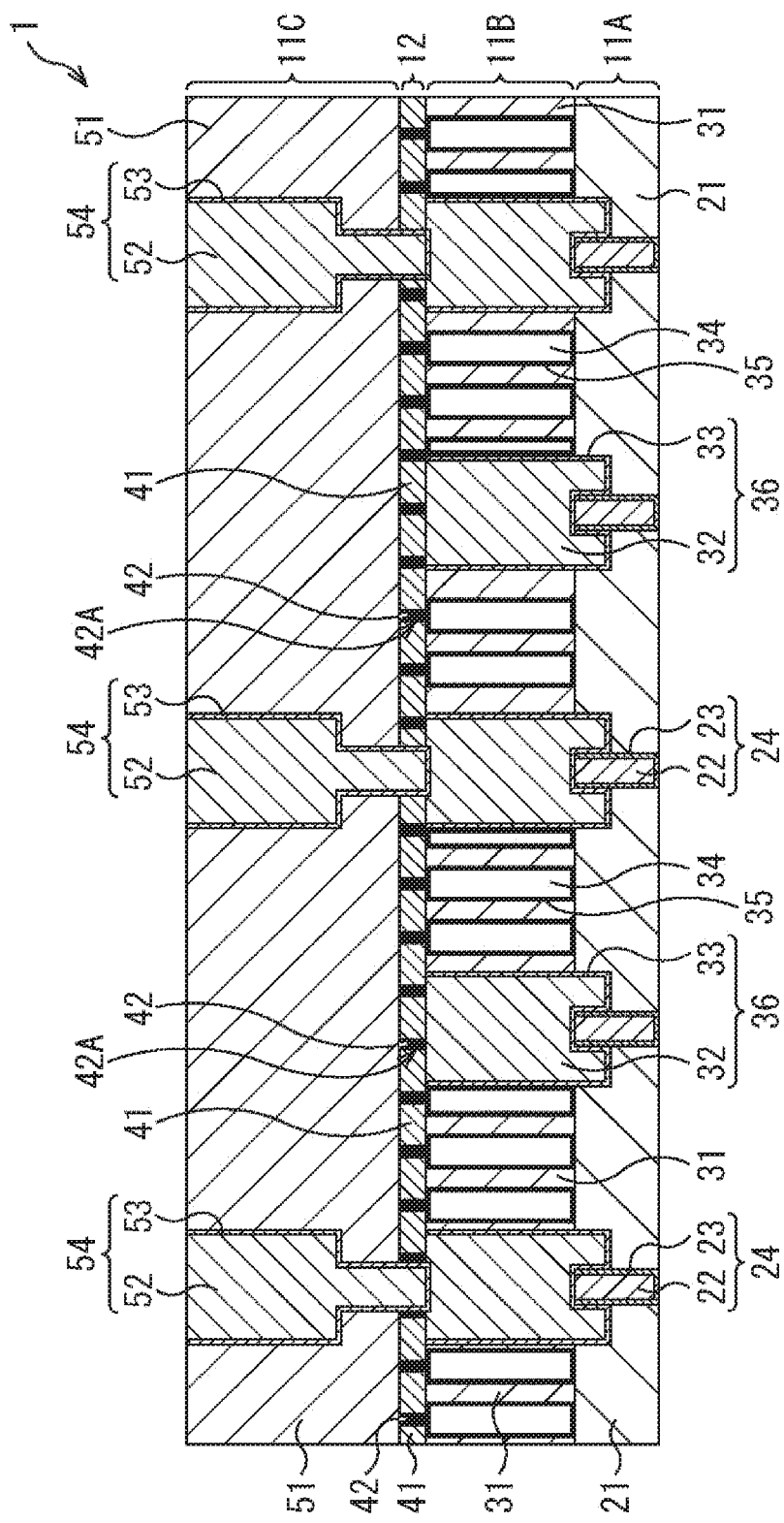
FIG. 1 is a cross-sectional view showing an example configuration of a first embodiment of a semiconductor device to which the present technology is applied.

FIG. 1 is a cross-sectional view showing an example configuration of a first embodiment of a semiconductor device to which the present technology is applied.

A semiconductor device 1 in FIG. 1 includes a multilayer wiring layer in which three wiring layers 11 and one diffusion preventing film 12 are stacked. More specifically, in the semiconductor device 1 in FIG. 1, a second wiring layer 11B is stacked on a first wiring layer 11A, and a third wiring layer 11C is stacked on the second wiring layer 11B via the diffusion preventing film 12.

Note that, although the semiconductor device 1 in FIG. 1 has a structure in which the three wiring layers 11 are stacked, the number of the wiring layers 11 to be stacked is not limited to three, and is only required to be larger than one.

In the first wiring layer 11A, a plurality of metallic films 22 for transmitting signals, power-supply voltage, and the like are formed at predetermined plane positions in an insulating film 21 having a predetermined thickness. The boundaries between the insulating film 21 and the metallic films 22 are covered with barrier metals 23. The metallic films 22 and the barrier metals 23 are collectively referred to as the metallic wiring lines 24.

In the second wiring layer 11B, a plurality of metallic films 32 for transmitting signals, power-supply voltage, and the like are formed at predetermined plane positions in an insulating film 31 having a predetermined thickness. Barrier metals 33 are formed on the outer peripheral surfaces of the metallic films 32. The metallic films 32 and the barrier metals 33 are collectively referred to as the metallic wiring lines 36.

In the second wiring layer 11B, air gaps (hollows) 34 are formed in the insulating film 31 between each two metallic films 32 adjacent to each other in the planar direction, and a protective film 35 is formed on the inner peripheral surface of each air gap 34. In the example in FIG. 1, a plurality of air gaps 34 is formed in the insulating film 31 between the adjacent metallic films 32, but the number of air gaps 34 between the adjacent metallic films 32 is only required to be at least one.

The metallic films 32 of the second wiring layer 11B are electrically connected to the metallic films 22 of the first wiring layer 11A.

The diffusion preventing film 12 on the second wiring layer 11B is a film for preventing diffusion of the metallic films 32 of the second wiring layer 11B, and has a configuration in which a second film 42 is buried in a large number of holes 42A formed in a first film 41. The second film 42 buried in the large number of holes 42A is formed with a film of the same material as the protective film 35 formed on the inner peripheral surfaces of the air gaps 34.

In the third wiring layer 11C, a plurality of metallic films 52 for transmitting signals, power-supply voltage, and the like are formed at predetermined plane positions in an insulating film 51 having a predetermined thickness. The boundaries between the insulating film 51 and the metallic films 52 are covered with barrier metals 53. The metallic films 52 and the barrier metals 53 are collectively referred to as the metallic wiring lines 54. The metallic films 52 of the third wiring layer 11C are electrically connected to the metallic films 32 of the second wiring layer 11B disposed below the third wiring layer 11C.

As described above, the semiconductor device 1 is formed by stacking the first wiring layer 11A having the insulating film 21 formed between the metallic films 22, and the second wiring layer 11B having the insulating film 31 formed between the metallic films 32. Further, the second wiring layer 11B having the insulating film 31 formed between the metallic films 32, and the third wiring layer 11C having the insulating film 51 formed between the metallic films 52 are stacked, with the diffusion preventing film 12 being interposed in between.

Further, of the three wiring layers 11A through 11C, one wiring layer 11B has a plurality of air gaps 34 formed in the insulating film 31 between the metallic films 32, so that the inter-wire capacitance of the metallic films 32 of the wiring layer 11B is reduced. The structure of the large number of air gaps 34 formed in the wiring layer 11B (this structure will be hereinafter also referred to simply as an air gap structure) are not limited by the wiring layout of the metallic wiring lines 24, and accordingly, can be formed in any desired region. In particular, the structure can be easily formed in a dense wiring pattern region.

The insulating films 21, 31, and 51 are formed with SiO2 films, low-k films (low-dielectric-constant insulating films), SiOC films, or the like, for example. The metallic films 22, 32, and 52 are formed with a material, such as tungsten (W), aluminum (Al), copper (Cu), or gold (Au), for example. The barrier metals 23, 33, and 53 are formed with a material such as Ta, TaN, Ti, or TiN, for example.

In this embodiment, the insulating film 21 is formed with a SiO2 film, for example, and the insulating films 31 and 51 are formed with low-k films, for example. The metallic films 22 are formed with tungsten, for example, and the metallic films 32 and 52 are formed with copper, for example. The barrier metals 23 are formed with Ti or TiN, for example, and the barrier metals 33 and 53 are formed with Ta or TaN, for example.

Note that the insulating films 21, 31, and 51 may be formed with the same material, or may be formed with different materials. The metallic films 22, 32, and 52, and the insulating films 21, 31, and 51 may be formed with the same material, or may be formed with different materials.

The material of the diffusion preventing film 12 is SiC, SiN, SiCN, SiCO, or the like. The first film 41 and the second film 42 may also be the same kind of film, or may be different films.

Referring now to FIGS. 2, 3A, 3B, and 3C, the structure of the large number of air gaps 34 formed in the second wiring layer 11B is further described.

FIG. 2 is an enlarged view of part of the semiconductor device 1 shown in FIG. 1, and a region including a portion in which a plurality of air gaps 34 is formed in the second wiring layer 11B.

In the cross-sectional view in FIG. 2, an opening width WDb, which is the lateral width of each air gap 34 formed in the insulating film 31 of the second wiring layer 11B, is the same as the opening width WDa of the holes 42A formed in the diffusion preventing film 12 on the second wiring layer 11B, or is greater than the opening width WDa.

Figure 3A:
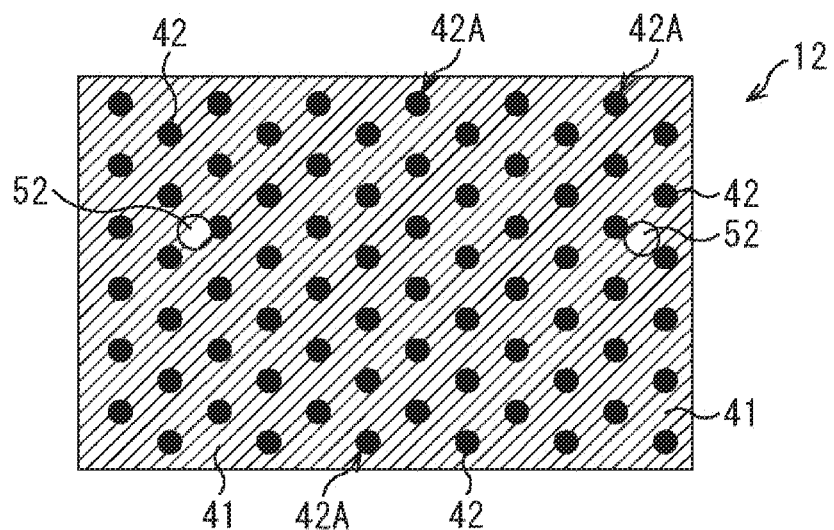
FIGS. 3A, 3B, and 3C are diagrams for explaining structures of air gaps.

FIG. 3A is a plan view of the diffusion preventing film 12 as viewed from above.

As shown in FIG. 3A, the diffusion preventing film 12 is formed by burying the second film 42 in the large number of holes 42A formed in the first film 41. The metallic films 52 shown in FIG. 3A are contact portions between the metallic films 52 of the third wiring layer 11C and the metallic films 32 of the second wiring layer 11B.

Figure 3B:
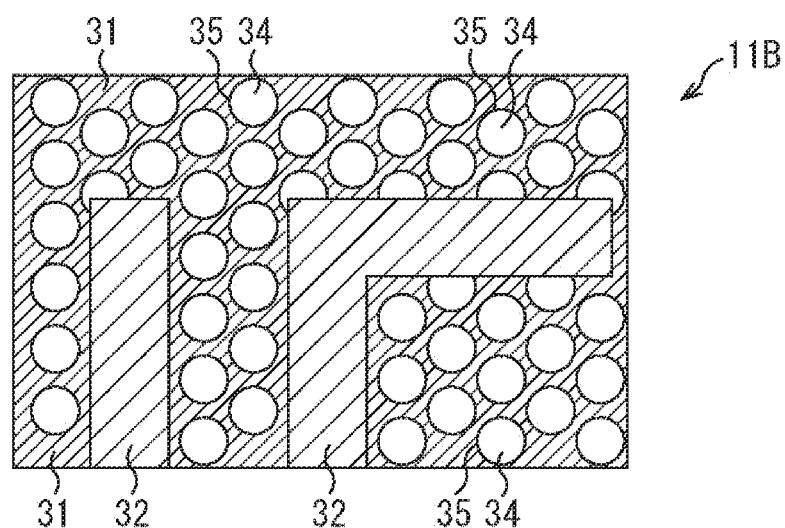

FIG. 3B is a plan view of the second wiring layer 11B as viewed from above.

As shown in FIG. 3B, in the second wiring layer 11B, the insulating film 31 and the air gaps 34 are formed in the region other than the metallic films 32 formed in predetermined regions. The protective film 35 is formed on the outer peripheries of the air gaps 34. Note that FIGS. 3A, 3B, and 3C does not show the barrier metals 33 formed on the outer peripheral portions of the metallic films 32.

Figure 3C:
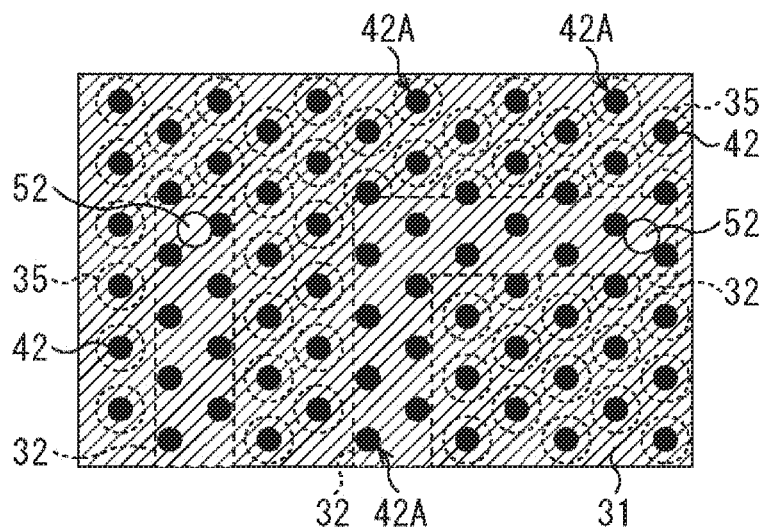

FIG. 3C is a diagram in which the diffusion preventing film 12 shown in FIG. 3A and the second wiring layer 11B shown in FIG. 3B are superimposed on each other. In FIG. 3C, the metallic films 32 and the protective film 35 of the second wiring layer 11B, which is the layer under the diffusion preventing film 12, are indicated by dashed lines.

As shown in FIGS. 3A, 3B, and 3C, the holes 42A are formed in the entire diffusion preventing film 12. However, the regions in which the air gaps 34 are formed in the second wiring layer 11B (the regions on the inner side of the protective film 35) are the regions other than the regions of formation of the metallic films 32. In other words, no air gaps 34 are formed in the regions of formation of the metallic films 32 of the second wiring layer 11B.

2. Method for Manufacturing the Semiconductor Device

Next, a method for manufacturing the semiconductor device 1 shown in FIG. 1 is described, with reference to FIGS. 6A, 4B, 4C, 4D, 5, 6A, 6B, 6C, and 6D.

Figure 4A:
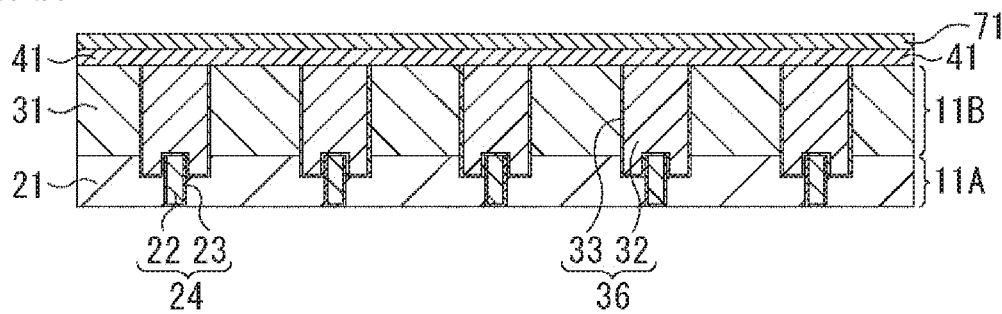
FIGS. 4A, 4B, 4C, and 4D are diagrams for explaining a method for manufacturing the semiconductor device shown in FIG. 1.

First, as shown in FIG. 4A, after the second wiring layer 11B is formed and stacked on the first wiring layer 11A, the first film 41 is formed on the entire surface, and a hard mask 71 is further formed on the first film 41. The first film 41 is a SiCN film, for example, but may be some other type of film such as a SiN film or a SiCO film as described above. Further, the hard mask 71 is a SiO2 film, for example, but is only required to be a film that keeps the etching selectivity with the first film 41 and the self-assembled film 73 (FIG. 5) to be formed in the next step. The thickness of the hard mask 71 may be about 20 nm, for example.

Figure 4B:
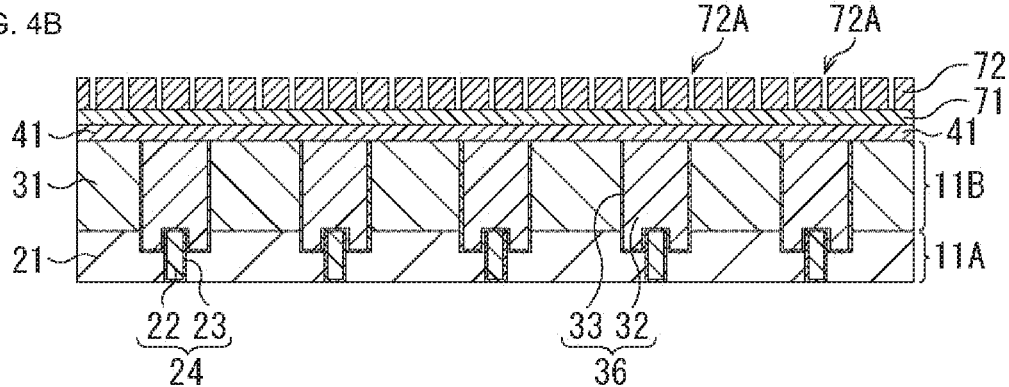

Next, as shown in FIG. 4B, a directed self-assembly (DSA) random pattern 72 in which a large number of holes 72A are formed is formed on the upper surface of the hard mask 71.

Figure 5:
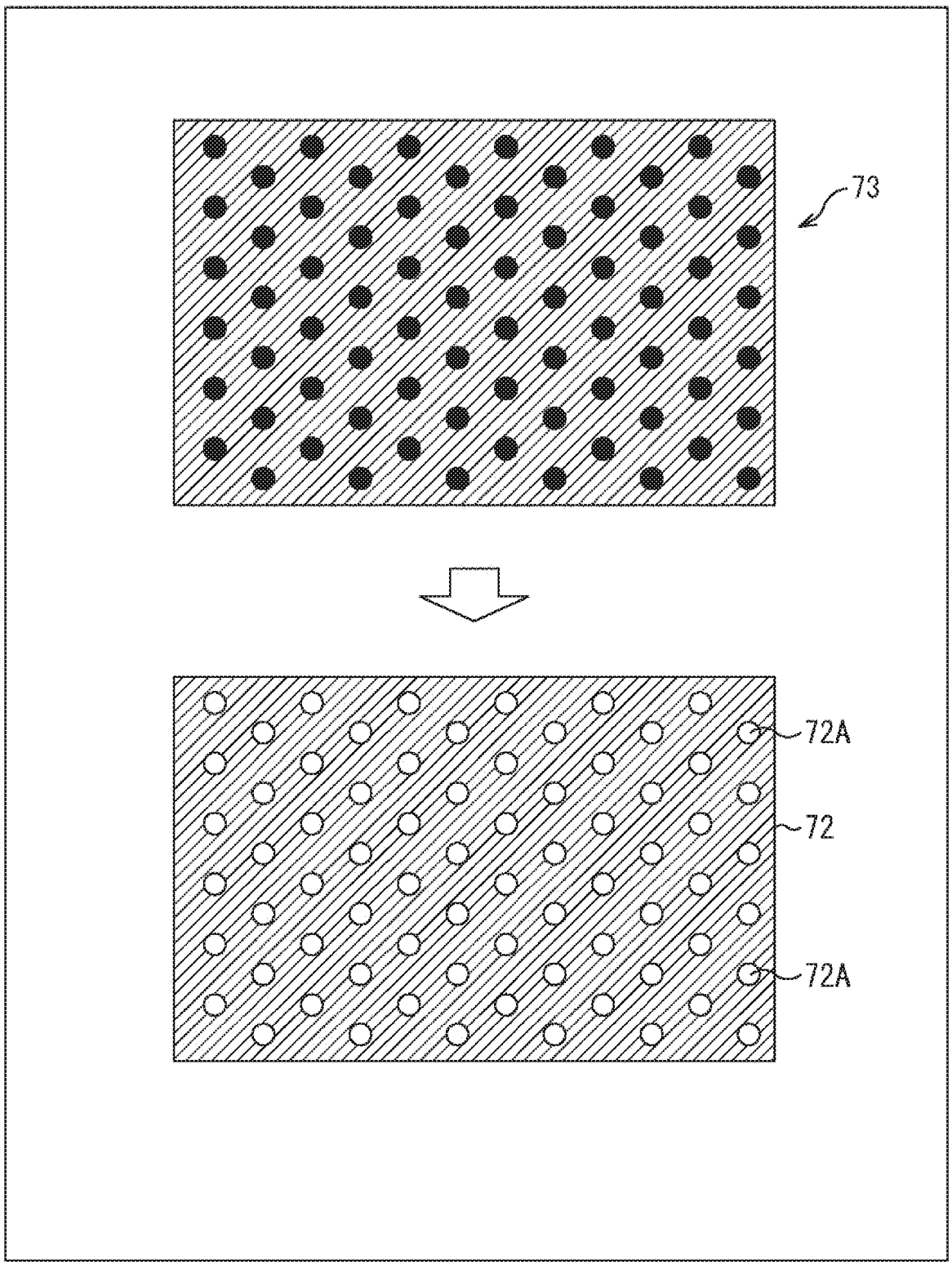
FIG. 5 is a diagram for explaining a method for manufacturing the semiconductor device shown in FIG. 1.

The DSA random pattern 72 is formed as follows. As shown in FIG. 5, when the self-assembled film 73 is applied onto the entire upper surface of the hard mask 71, a self-assembled pattern is formed by the self-assembly phenomenon of the block copolymer. One of the polymers of the formed self-assembled pattern is selectively removed, so that the DSA random pattern 72 having the large number of holes 72A formed therein is formed.

Figure 4C:
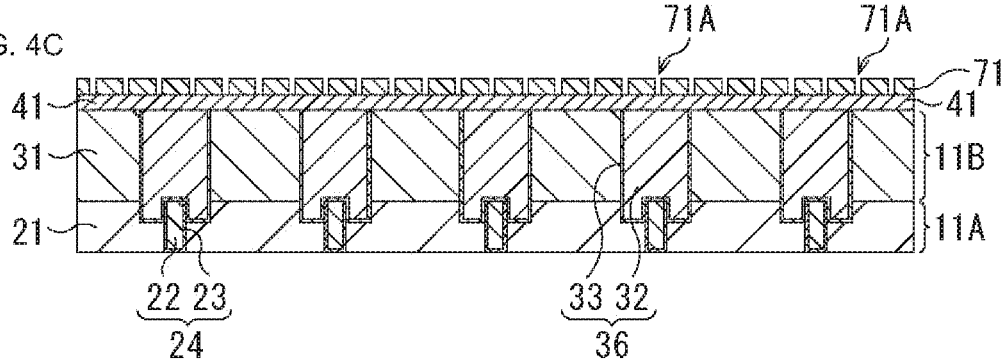

Referring back to FIG. 4B, with the DSA random pattern 72 serving as the mask, etching is performed on the hard mask 71, so that the DSA random pattern 72 is transferred to the hard mask 71 as shown in FIG. 4C. As a result, a large number of holes 71A are also formed in the hard mask 71.

Figure 4D:
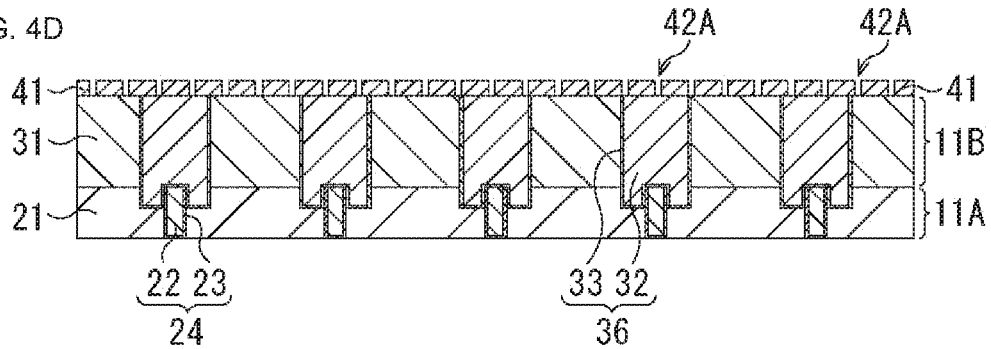

As shown in FIG. 4D, patterning is then performed on the first film 41, on the basis of the hard mask 71 having the large number of holes 71A formed therein. As a result, the large number of holes 42A are formed in the first film 41.

Figure 6A:
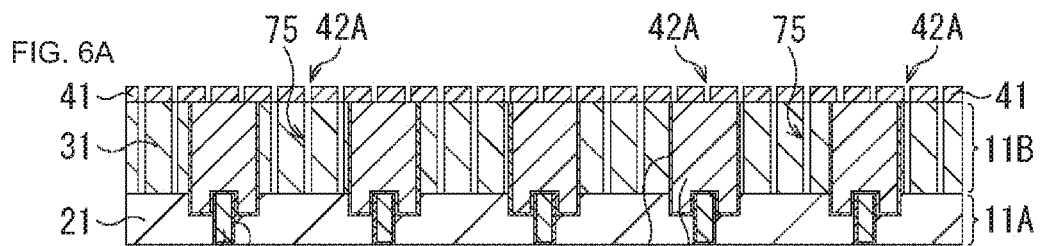
FIGS. 6A, 6B, 6C, and 6D are diagrams for explaining a method for manufacturing the semiconductor device shown in FIG. 1.

Next, as shown in FIG. 6A, with the first film 41 having the large number of holes 42A formed therein being used as the mask, etching is performed on the insulating film 31 of the second wiring layer 11B, so that grooves 75 are formed in the insulating film 31. The width of the groove 75 formed in this step is the same as the width of the holes 42A of the first film 41.

Figure 6B:
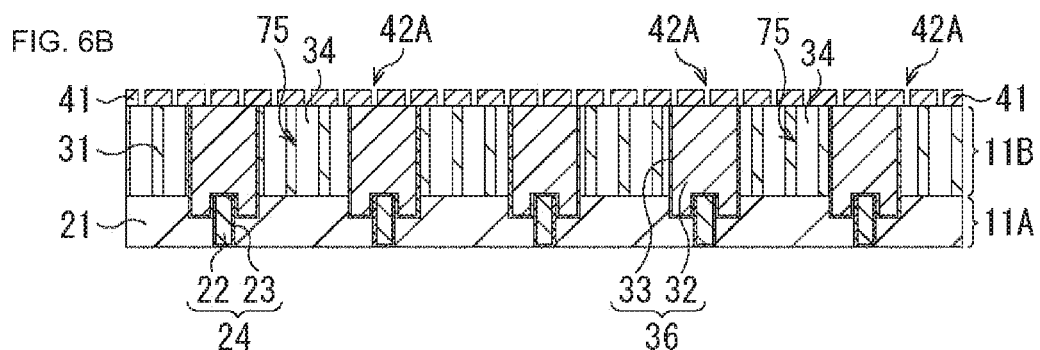

After the insulating film 31 is altered by ashing, the altered insulating film 31 is then removed by WET processing, so that the grooves 75 in the insulating film 31 are expanded in the width direction, and the air gaps 34 having a greater opening width than the opening width of the holes 42A are formed, as shown in FIG. 6B. The amount of expansion (recess amount) in the width direction of the groove 75 depends on the thickness of the altered layer, and it is possible to adjust the thickness of the altered layer by controlling the process conditions for the ashing.

Note that, in a case where the insulating film 31 is formed with a low-k film, the insulating film 31 is altered by ashing as described above, and the altered insulating film 31 is then removed by WET etching in the process. For example, in a case where the insulating film 31 is formed with a SiO2 film, ashing is not performed, and the opening width of the holes 42A can be made greater only by WET etching.

Figure 6C:
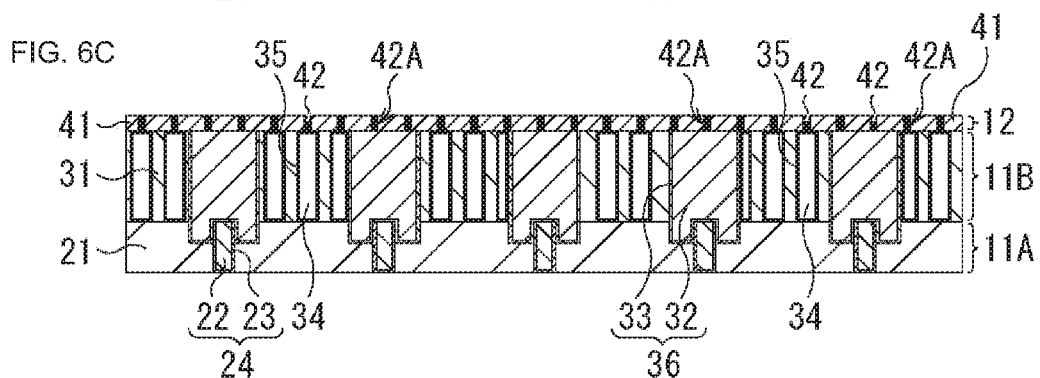

Next, as shown in FIG. 6C, the protective film 35 is conformally formed on the inner peripheral surfaces of the grooves 75 formed in the insulating film 31 of the second wiring layer 11B. Through the step of forming the protective film 35, the protective film 35 is also formed in the holes 42A in the first film 41, and, depending on the sizes of the holes 42A, the holes 42A are blocked with the protective film 35 (pinch-off), and thus, the second film 42 is formed. As a result, the diffusion preventing film 12 in which the second film 42 is buried in the large number of holes 42A in the first film 41 is formed.

Accordingly, the protective film 35 and the second film 42 are formed with the same material in the same step, and are a SiCN film, a SiN film, a SiCO film, or the like, for example. Note that the side surfaces of the large number of holes 42A formed in the first film 41 may have a film formed from the first film 41 that has been oxidized, and have a high ratio of oxygen.

In the step in FIG. 6B of performing etching on the altered insulating film 31 to expand the width of the grooves 75, etching of the insulating film 31 may be continued until reaching the metallic films 32 in the grooves 75 close to the metallic films 32, and the metallic films 32 may be exposed in some cases. Even in such a state, the protective film 35 is conformally formed, and thus, the metallic films 32 can be protected.

Figure 6D:
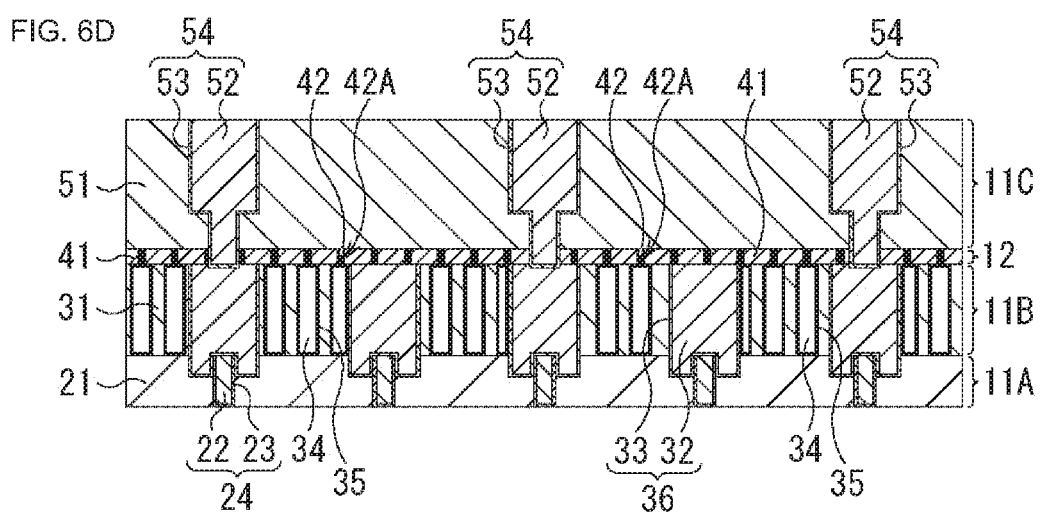

Next, as shown in FIG. 6D, the third wiring layer 11C is formed on the upper surface of the diffusion preventing film 12. For example, openings are formed at predetermined plane positions in the insulating film 51 formed on the entire surface, and the barrier metals 53 are formed by a sputtering technique, for example. After that, the metallic films 52 are formed with copper (Cu) by a damascene technique. Thus, the third wiring layer 11C is formed.

Even in a case where the holes 42A are not blocked with the protective film 35 when the protective film 35 is conformally formed on the inner peripheral surfaces of the grooves 75 formed in the insulating film 31 of the second wiring layer 11B, the holes 42A are blocked with the protective film 35 through the step of forming the insulating film 51 with a low-k film or the like.

As described above, by a self-assembly lithography technique, the honeycomb DSA random pattern 72 is formed on the upper surface of the second wiring layer 11B in which the insulating film 31 is formed between the metallic films 32 disposed in a predetermined planar region. With the DSA random pattern 72 being used as the mask, the large number of holes 42A are formed in the first film 41 serving as the diffusion preventing film 12. With the first film 41 having the large number of holes 42A being used as the mask, etching is performed on the insulating film 31, so that the air gaps 34 having a greater opening width than the opening width of the holes 42A are formed in the insulating film 31 under the large number of holes 42A.

The air gaps 34 are formed in the insulating film 31 of the second wiring layer 11B, on the basis of the DSA random pattern 72 using a self-assembly lithography technique (DSA). Accordingly, high-precision alignment is not required, and the air gaps 34 can be formed in any appropriate region, regardless of the positions of formation of the metallic films 32.

That is, with the structure of the semiconductor device 1 shown in FIG. 1 and the method for manufacturing the semiconductor device 1, an air gap structure can be formed in any appropriate region, regardless of the layout of the metallic wiring lines. Further, as the air gap structure is formed, the wiring capacitance can be lowered. It is also possible to control the k-value between wiring lines by adjusting the amount of expansion (recess amount) of the grooves 75 in the width direction.

3. Second Embodiment

Figure 7:
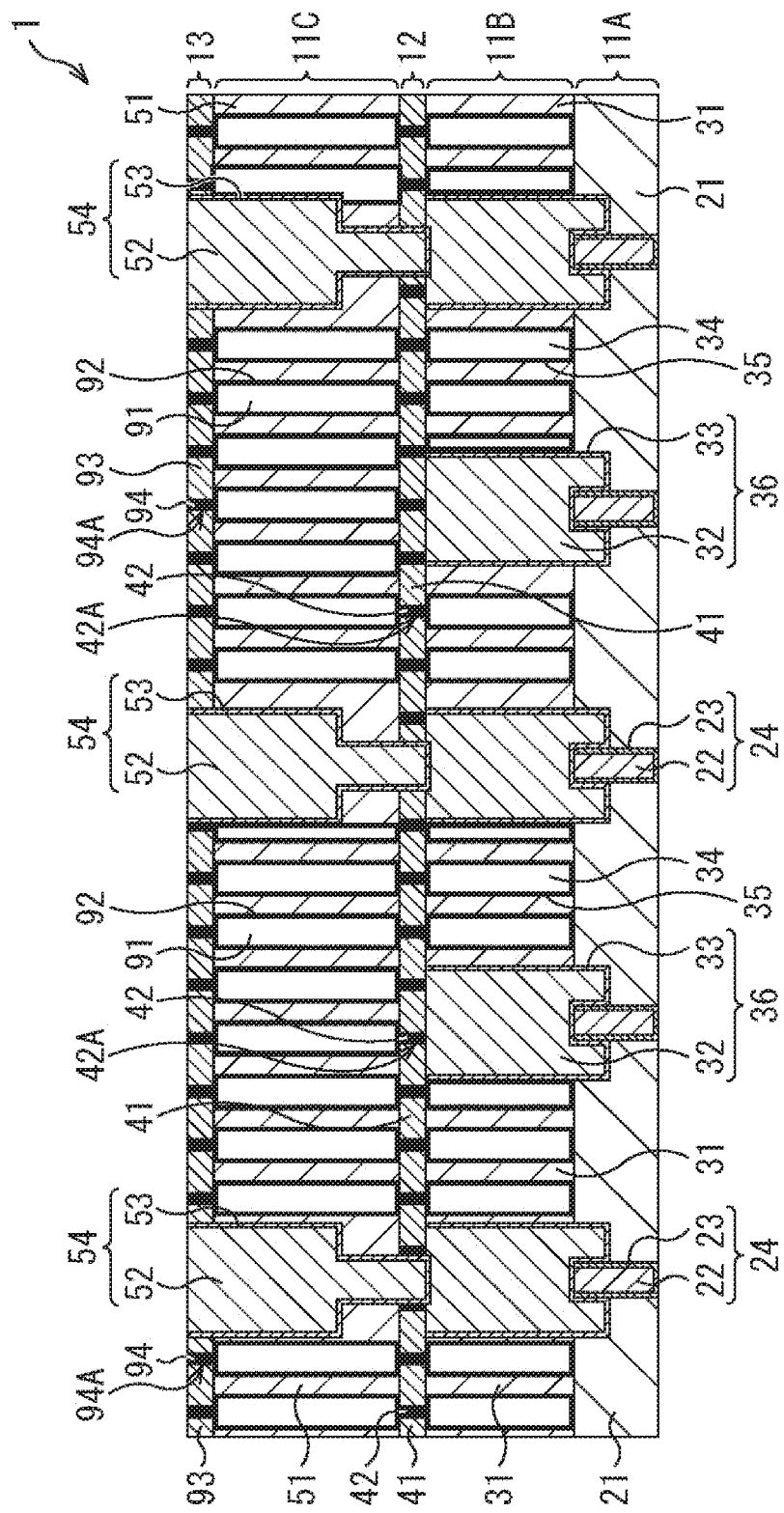
FIG. 7 is a cross-sectional view showing an example configuration of a second embodiment of a semiconductor device to which the present technology is applied.

FIG. 7 is a cross-sectional view showing an example configuration of a second embodiment of a semiconductor device to which the present technology is applied.

In the second embodiment shown in FIG. 7, the components corresponding to those of the first embodiment shown in FIG. 1 are denoted by the same reference numerals as those used in FIG. 1, and explanation of them is not made herein. Instead, the components different from those of the first embodiment are mainly explained.

In the first embodiment shown in FIG. 1, no air gaps are formed in the insulating film 51 of the third wiring layer 11C. However, a plurality of air gaps (hollows) 91 is formed in the insulating film 51 of the third wiring layer 11C of the semiconductor device 1 shown in FIG. 7. A protective film 92 is also formed on the inner peripheral surfaces of the air gaps 91.

The second embodiment shown in FIG. 7 also differs from the first embodiment in that a diffusion preventing film 13 that prevents diffusion of the metallic films 52 of the third wiring layer 11C is further formed on the upper surface of the third wiring layer 11C.

The diffusion preventing film 13 is formed with a second film 94 buried in a large number of holes 94A formed in a first film 93. The second film 94 buried in the large number of holes 94A is formed with a film of the same material as the protective film 92 formed on the inner peripheral surfaces of the air gaps 91.

That is, in the semiconductor device 1 shown in FIG. 7, like the second wiring layer 11B, the third wiring layer 11C stacked on the second wiring layer 11B via the diffusion preventing film 12 also has an air gap structure having a plurality of air gaps 91 formed in the insulating film 51 between each two metallic films 52 adjacent to each other in the planar direction.

As described above, the air gap structure in which a large number of air gaps are formed in the insulating film between metallic films can be applied not only to a single wiring layer (the second wiring layer 11B) but also to a plurality of wiring layers (the second wiring layer 11B and the third wiring layer 11C). The air gap structure is not necessarily applied to two wiring layers, but may be applied to three or more wiring layers.

4. Third Embodiment

Figure 8:
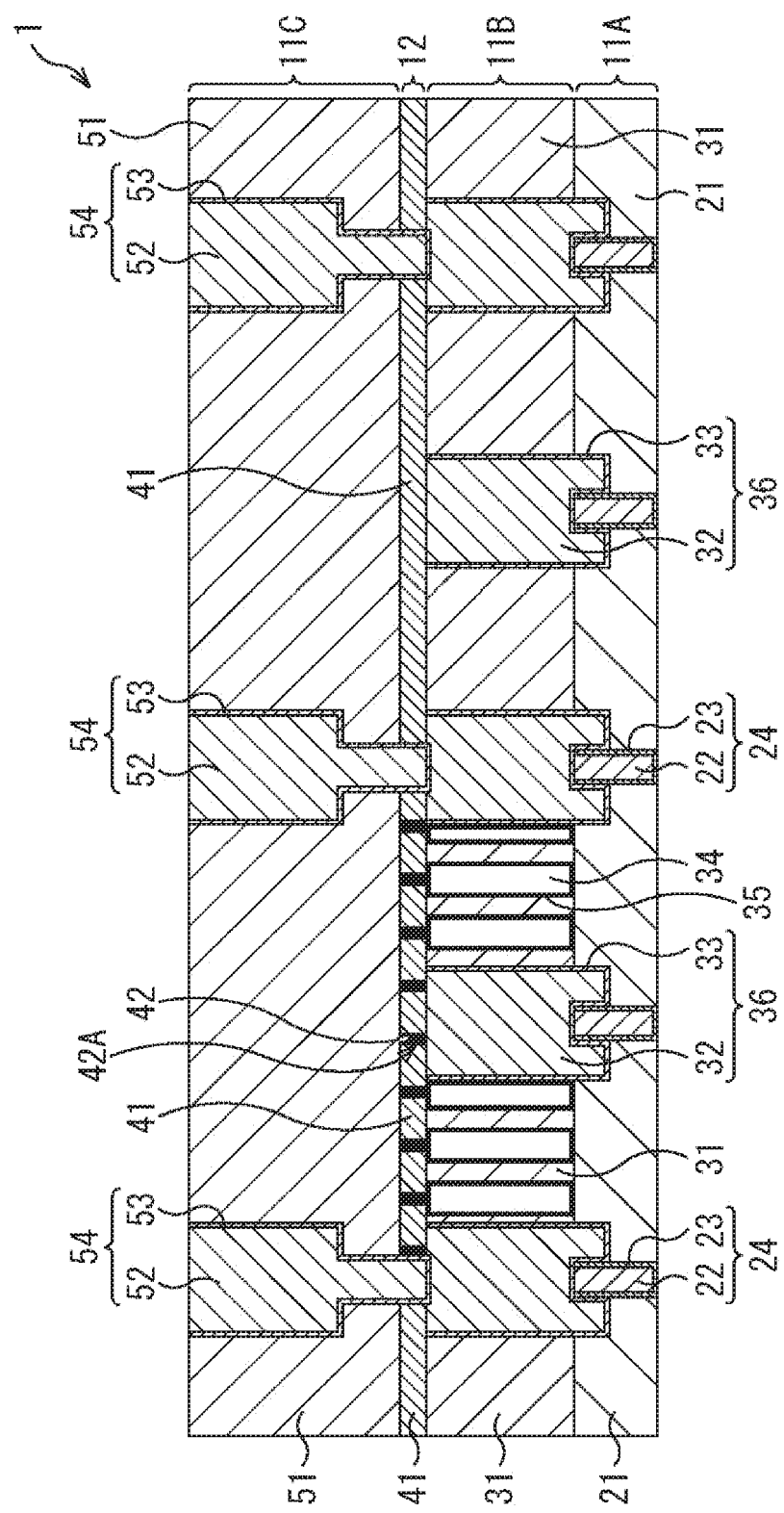
FIG. 8 is a cross-sectional view showing an example configuration of a third embodiment of a semiconductor device to which the present technology is applied.

FIG. 8 is a cross-sectional view showing an example configuration of a third embodiment of a semiconductor device to which the present technology is applied.

In the third embodiment shown in FIG. 8, the components corresponding to those of the first embodiment shown in FIG. 1 are denoted by the same reference numerals as those used in FIG. 1, and explanation of them is not made herein. Instead, the components different from those of the first embodiment are mainly explained.

In the first embodiment shown in FIG. 1, the air gap structure (the air gaps 34 and the protective film 35) is formed in all the regions of the insulating film 31 between the metallic films 32 of the second wiring layer 11B. However, the third embodiment shown in FIG. 8 differs from the first embodiment in that the air gap structure is not formed in part of the insulating film 31. The other aspects of the structure of the semiconductor device 1 shown in FIG. 8 are similar to those of the semiconductor device 1 shown in FIG. 1.

As described above, the air gap structure (the air gaps 34 and the protective film 35) may be formed only in part of the region of the insulating film 31 of the second wiring layer 11B.

Figure 9:
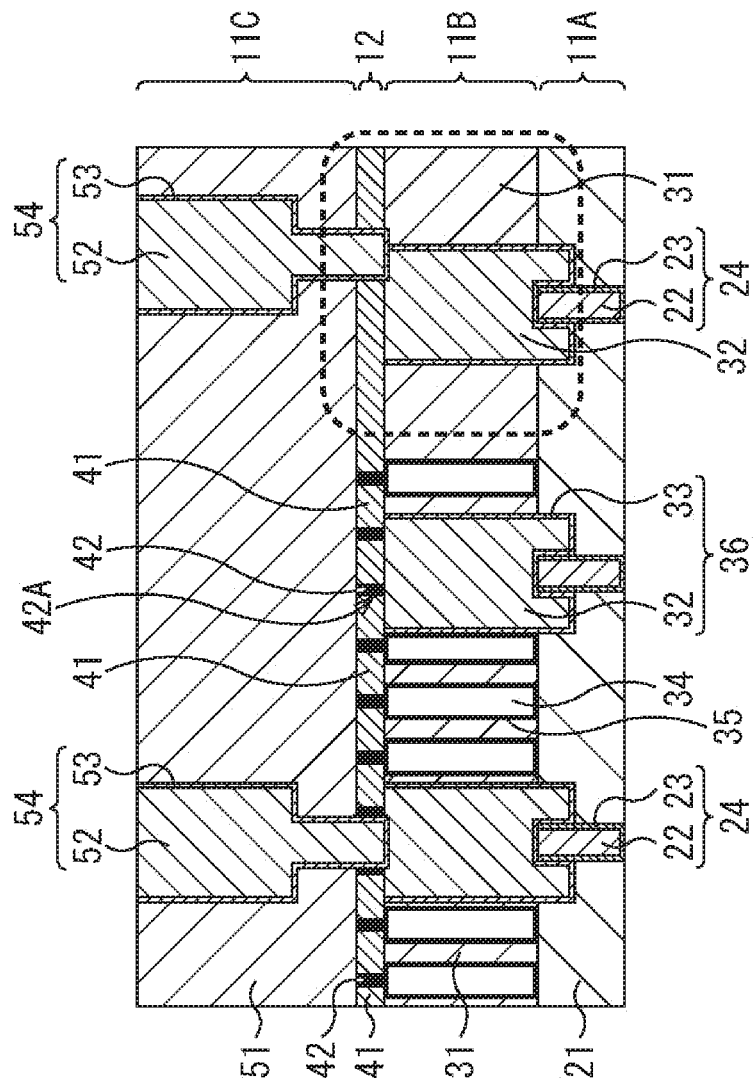
FIG. 9 is a diagram showing an example application of the configuration of the third embodiment.

In the insulating film 31 of the second wiring layer 11B, the region in which the air gap structure is not formed may be a region in which the accuracy of alignment between the metallic films 32 of the second wiring layer 11B and the metallic films 52 of the third wiring layer 11C connected to the metallic films 32 is low as in the region surrounded by a dashed line in FIG. 9, for example. In other words, the region in which the air gap structure is not formed may be a region in which some of the contact portions of the metallic films 52 of the third wiring layer 11C might be disconnected from the metallic films 32.

Figure 10:
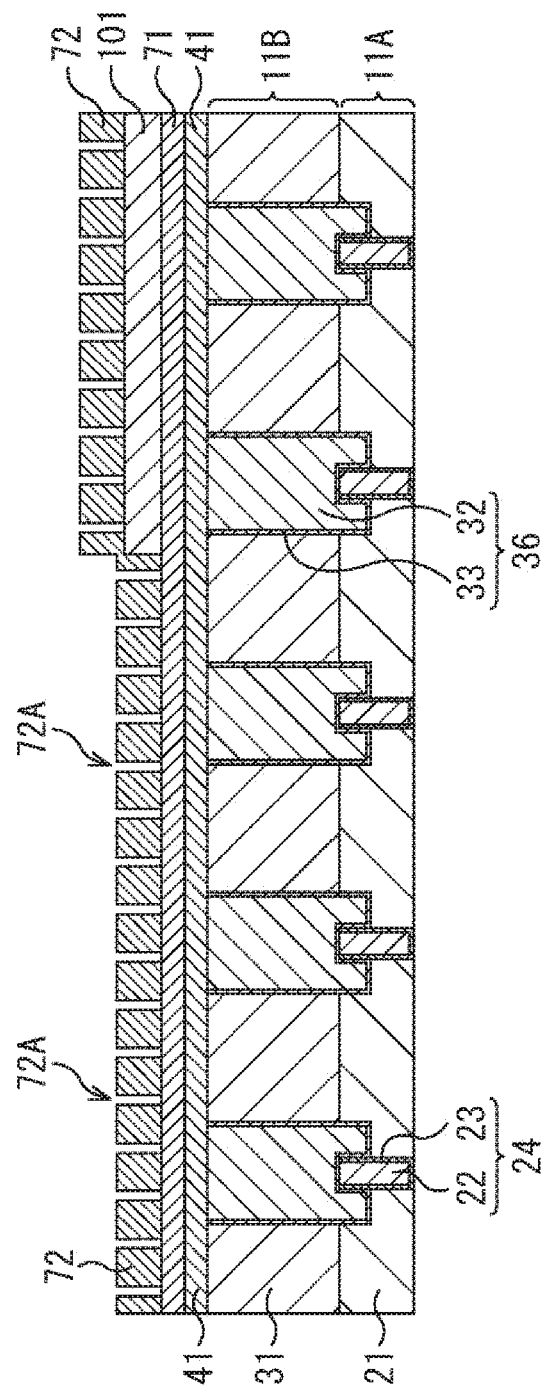
FIG. 10 is a diagram for explaining a method for manufacturing a semiconductor device according to the third embodiment.

In a case where a region in which the air gaps 34 are not to be formed is created, patterning is performed on a resist 101 in the region in which the air gaps 34 are not to be formed, and the DSA random pattern 72 is then formed, as shown in FIG. 10.

Note that, in the third embodiment shown in FIG. 8, the structure of the third wiring layer 11C is similar to that of the first embodiment. However, an air gap structure (the air gaps 91 and protective film 92) may be further formed in the entire insulating films 51 between the metallic films 52 of the third wiring layer 11C, as in the second embodiment shown in FIG. 7. Alternatively, an air gap structure may be further formed only in part of the region of the insulating film 51 between the metallic films 52 of the third wiring layer 11C, as in the second wiring layer 11B of the third embodiment.

5. Modifications

Figure 11:
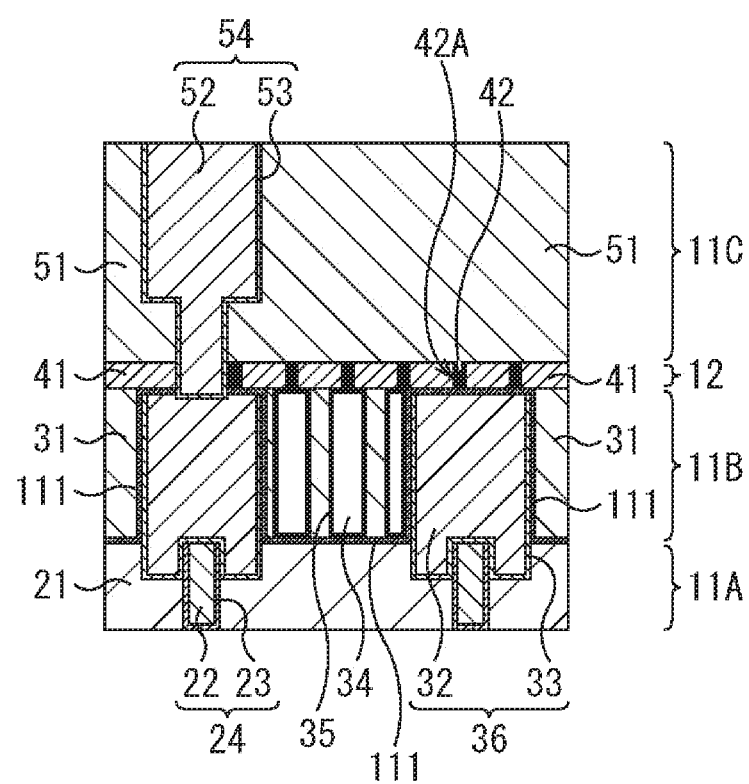
FIG. 11 is a cross-sectional view of a first modification of each embodiment.

FIG. 11 is a cross-sectional view of a first modification of each of the embodiments described above.

In the first modification shown in FIG. 11, a protective film 111 is further formed between the insulating film 31 of the second wiring layer 11B and the insulating film 21 of the first wiring layer 11A. In the region in which the metallic wiring lines 36 of the second wiring layer 11B are formed, the protective film 111 is formed on the outer side of the barrier metals 33, and between the metallic films 32 and the diffusion preventing film 12, so as to cover the barrier metals 33. The material of the protective film 111 may be SiC, SiN, SiCN, SiCO, or the like, like the material of the diffusion preventing film 12.

As the protective film 111 is added in this manner, exposure of the barrier metals 33 due to the etching of the insulating film 31 can be prevented in the process of etching of the insulating film 31 described with reference to FIG. 6A, and in the process of forming the air gaps 34 for expanding the grooves 75 in the width direction as described with reference to FIG. 6B. Thus, damage to the barrier metals 33 and the metallic films 32 can be prevented.

Figure 12:
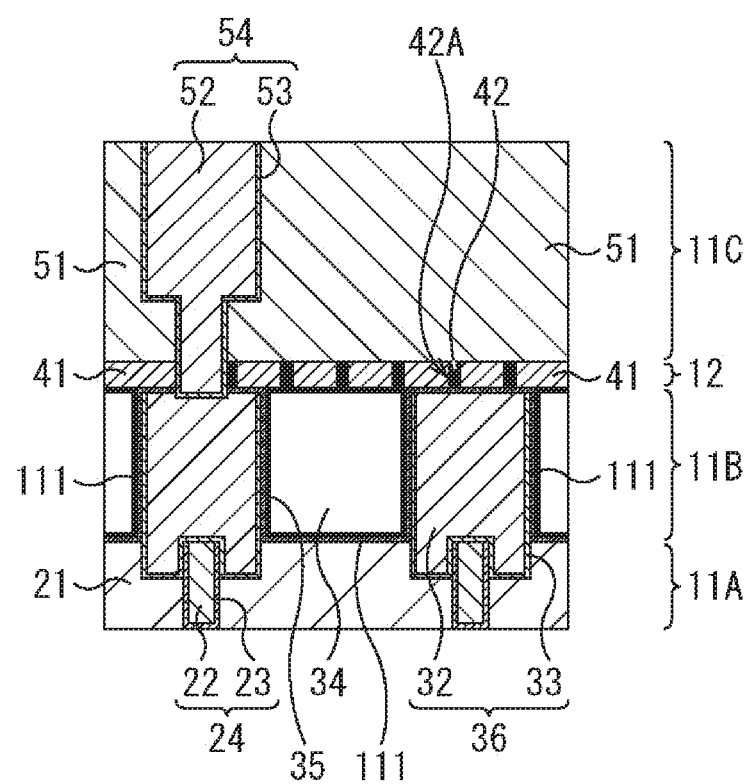
FIG. 12 is a cross-sectional view of a second modification of each embodiment.

FIG. 12 is a cross-sectional view of a second modification of each of the embodiments described above.

The second modification shown in FIG. 12 differs from each of the embodiments described above, not only in that a protective film 111 similar to that of the first modification shown in FIG. 11 is added to the second wiring layer 11B, but also in that the insulating film 31 does not exist between the metallic wiring lines 36 adjacent to one another.

In other words, in the second wiring layer 11B, only one air gap 34 and the protective film 35 exist between the protective film 111 that protects a predetermined metallic wiring line 36 and the protective film 111 that protects a metallic wiring line 36 adjacent thereto. In the step of forming the air gaps 34 that expand the grooves 75 in the width direction described with reference to FIG. 6B, the insulating film 31 is removed until each groove 75 reaches an adjacent groove 75, so that the air gap 34 shown in FIG. 12 can be formed. The diffusion preventing film 12 is a film in which the second film 42 is buried in a large number of holes 42A formed in the first film 41. However, the diameter of the holes 42A is extremely small. Accordingly, mechanical strength is maintained even after the insulating film 31 between the metallic wiring lines 36 is removed to leave only the air gaps 34.

Referring now to FIGS. 13A, 13B, 13C, and 13D, a method for manufacturing a semiconductor device 1 in a case where the protective film 111 is formed is described.

Figure 13A:
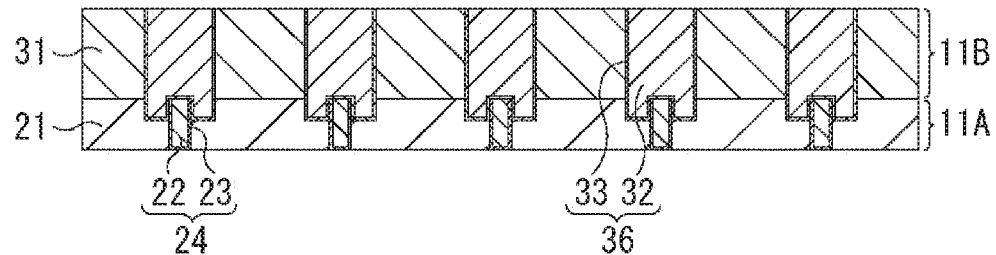
FIGS. 13A, 13B, 13C, and 13D are diagrams for explaining a method for manufacturing the semiconductor device shown in FIG. 11.
Figure 13B:
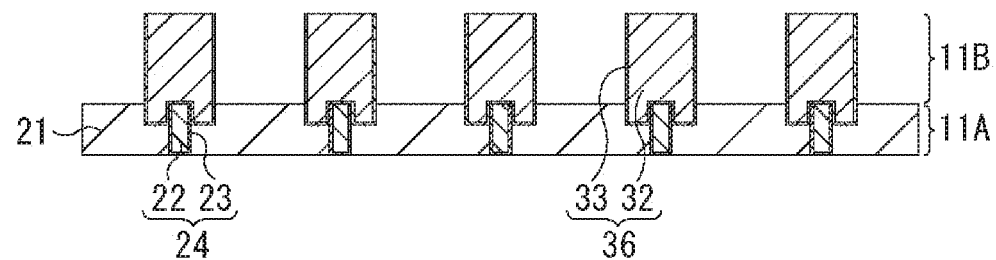

First, as shown in FIG. 13A, the first wiring layer 11A, and the second wiring layer 11B on the first wiring layer 11A are formed. After that, as shown in FIG. 13B, the insulating film 31 of the second wiring layer 11B is temporarily removed.

Figure 13C:
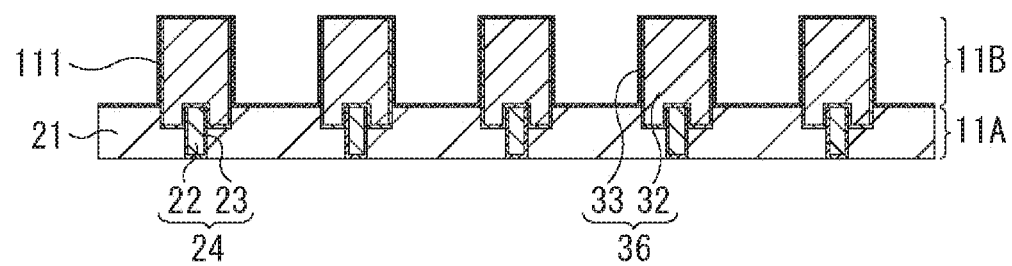

As shown in FIG. 13C, the protective film 111 is formed on the surfaces of the first wiring layer 11A and the second wiring layer 11B after the insulating film 31 is removed. Specifically, the protective film 111 is formed on the upper surface of the insulating film 21 of the first wiring layer 11A, and the upper surfaces and the side surfaces of the metallic wiring lines 36 of the second wiring layer 11B.

Figure 13D:
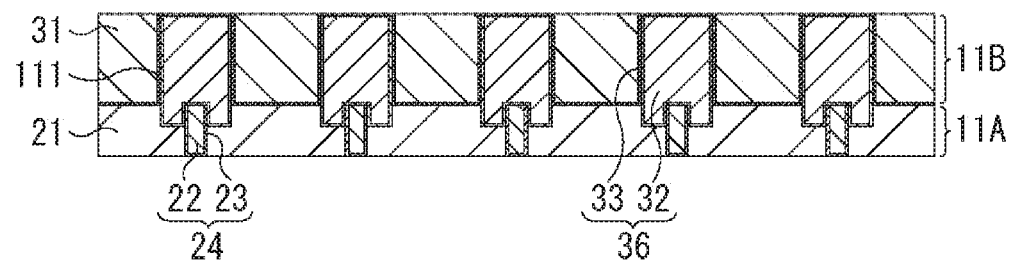

After that, as shown in FIG. 13D, the insulating film 31 of the second wiring layer 11B is again formed. The steps after that are similar to those of the method described with reference to FIGS. 4A, 4B, 4C, 4D, 5, 6A, 6B, 6C, and 6D.

In the above manner, the semiconductor device 1 in which the protective film 111 is formed can be manufactured.

6. Example of Application to a Solid-State Imaging Device

The semiconductor device 1 is a device having an air gap structure such as the air gaps 34 and the protective film 35 described above in at least one of the wiring layers (wiring layers 11). For example, the semiconductor device 1 can be formed as any appropriate device or an electronic apparatus having wiring layers, such as a communication device, a control device, and a solid-state imaging device.

In the description below, an example in which the air gap structure described above is applied to a solid-state imaging device is described.

(General Example Configuration of a Solid-State Imaging Device)

Figure 14:
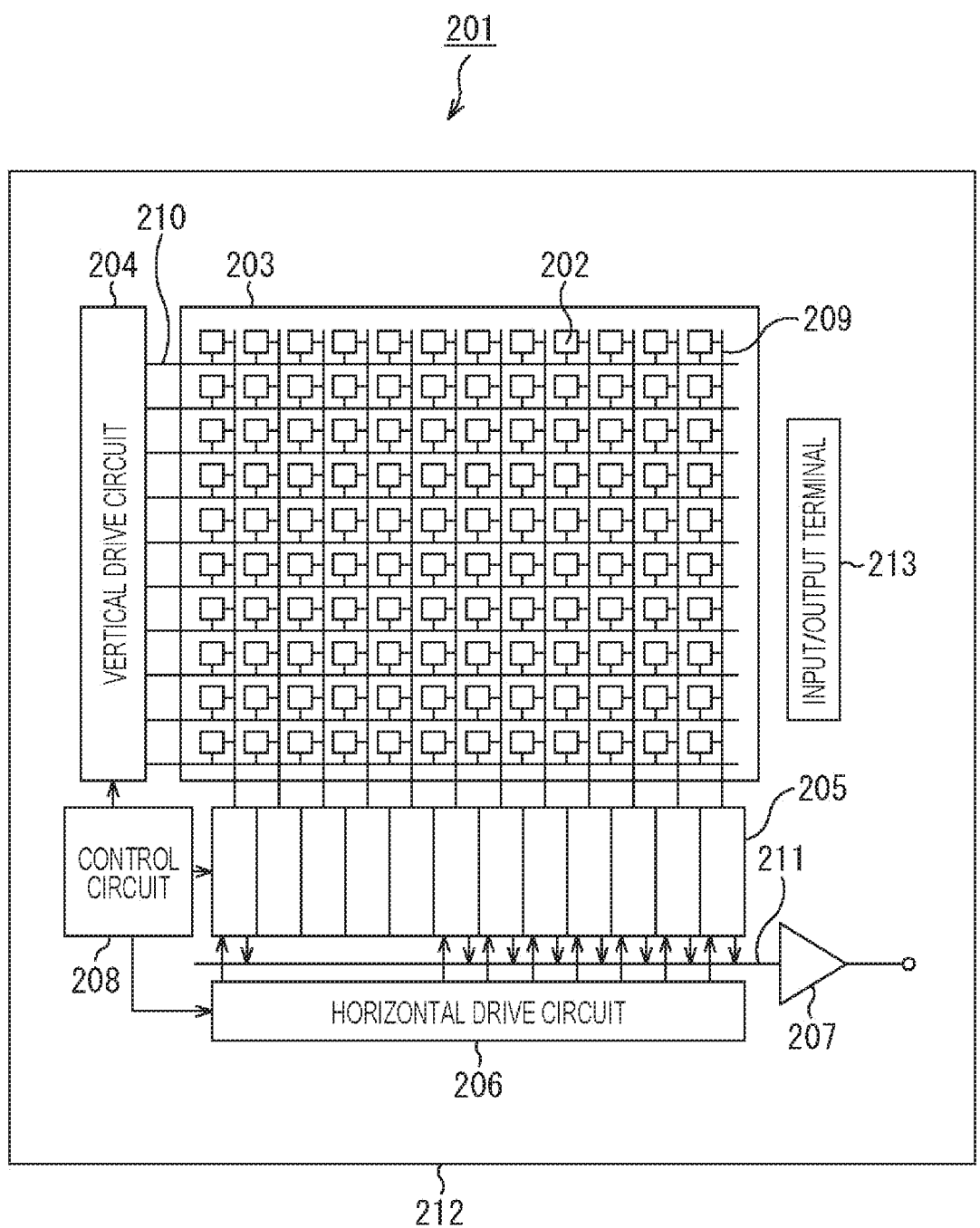
FIG. 14 is a diagram schematically showing the configuration of a solid-state imaging device to which the present technology is applied.

FIG. 14 schematically shows the configuration of a solid-state imaging device to which present technology is applied.

A solid-state imaging device 201 shown in FIG. 14 includes a pixel region 203 having pixels 202 arranged in a two-dimensional array on a semiconductor substrate 212 using silicon (Si) as the semiconductor, for example, and a peripheral circuit region around the pixel region 203. The peripheral circuit region includes a vertical drive circuit 204, column signal processing circuits 205, a horizontal drive circuit 206, an output circuit 207, a control circuit 208, and the like.

A pixel 202 includes a photodiode as a photoelectric conversion element, and a transfer transistor. A floating diffusion (hereinafter abbreviated as FD), a selection transistor, a reset transistor, and an amplification transistor are shared by a plurality of pixels 202.

That is, as will be described later in detail with reference to FIG. 15, the solid-state imaging device 201 has a photodiode and a transfer transistor for each pixel, but adopts a sharing pixel structure in which a FD, a selection transistor, a reset transistor, and an amplification transistor are shared by a plurality of pixels. However, each pixel may be provided with the respective pixel transistors: a FD, a selection transistor, a reset transistor, and an amplification transistor.

The control circuit 208 receives an input clock and data that designates an operation mode and the like, and also outputs data such as internal information about the solid-state imaging device 201. That is, on the basis of a vertical synchronization signal, a horizontal synchronization signal, and a master clock, the control circuit 208 generates a clock signal and a control signal that serve as the references for operation of the vertical drive circuit 204, the column signal processing circuits 205, the horizontal drive circuit 206, and the like. The control circuit 208 then outputs the generated clock signal and control signal to the vertical drive circuit 204, the column signal processing circuits 205, the horizontal drive circuit 206, and the like.

The vertical drive circuit 204 is formed with a shift register, for example, selects a predetermined pixel drive line 210, supplies a pulse for driving the pixels 202 connected to the selected pixel drive line 210, and drives the pixels 202 on a row-by-row basis. Specifically, the vertical drive circuit 204 sequentially selects and scans the respective pixels 202 in the pixel region 203 on a row-by-row basis in the vertical direction, and supplies pixel signals based on the signal charges generated in accordance with the amounts of light received in the photoelectric conversion units of the respective pixels 202, to the column signal processing circuits 205 through vertical signal lines 209.

The column signal processing circuits 205 are provided for the respective columns of the pixels 202, and perform signal processing such as denoising, on a column-by-column basis, on signals that are output from the pixels 202 of one row. For example, the column signal processing circuits 205 perform signal processing such as correlated double sampling (CDS) for removing fixed pattern noise inherent to pixels, and AD conversion.

The horizontal drive circuit 206 is formed with a shift register, for example. The horizontal drive circuit 206 sequentially selects the respective column signal processing circuits 205 by sequentially outputting horizontal scan pulses, and causes the respective column signal processing circuits 205 to output pixel signals to a horizontal signal line 211.

The output circuit 207 performs signal processing on signals sequentially supplied from the respective column signal processing circuits 205 through the horizontal signal line 211, and outputs the processed signals. The output circuit 207 might perform only buffering, or might perform black level control, column variation correction, various kinds of digital signal processing, and the like, for example. An input/output terminal 213 exchanges signals with the outside.

The solid-state imaging device 201 having the above configuration is a so-called column AD-type CMOS image sensor in which the column signal processing circuits 205 that perform CDS and AD conversion are provided for the respective pixel columns.

For example, the solid-state imaging device 201 is formed with a back-illuminated MOS solid-state imaging device in which light enters from the back surface side on the opposite side from the front surface side of the semiconductor substrate 212 having the pixel transistors formed thereon.

(Example Circuit of a Sharing Pixel Structure)

Figure 15:
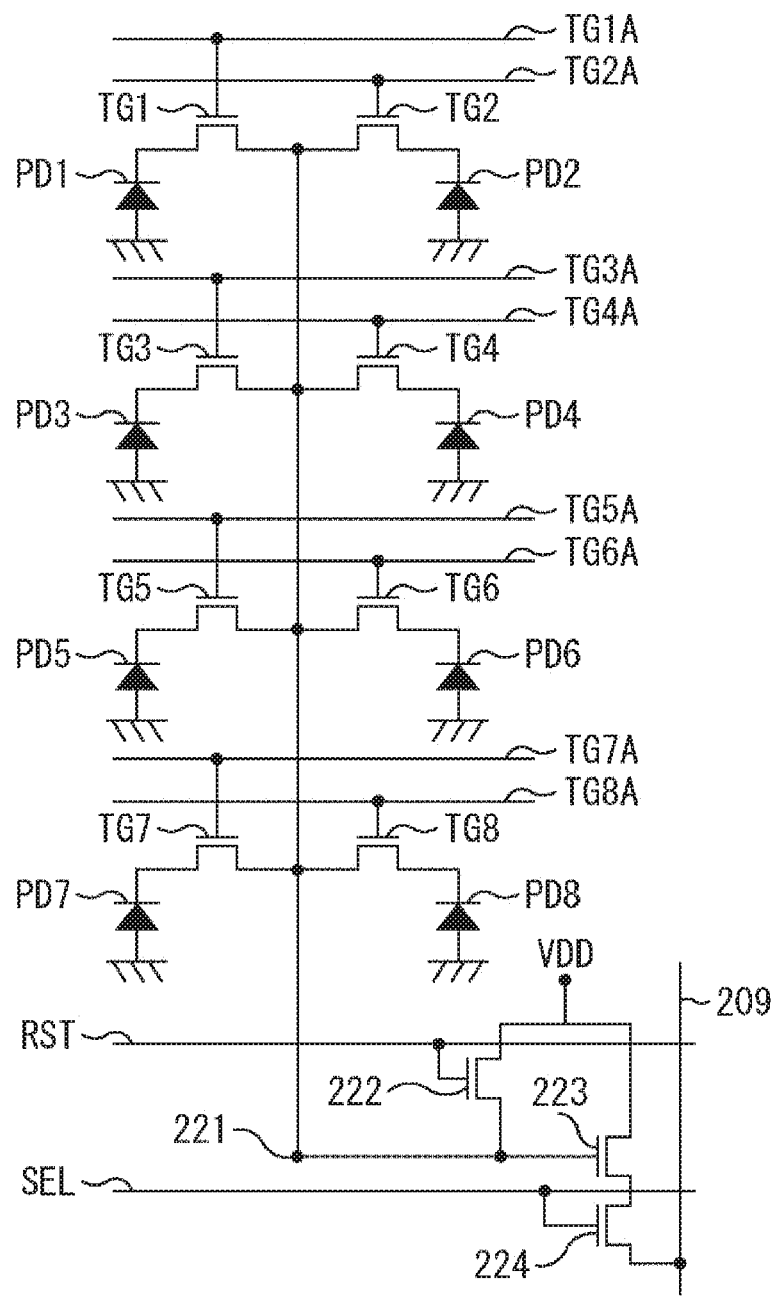
FIG. 15 is a circuit diagram of the sharing pixel structure of the solid-state imaging device shown in FIG. 14.

FIG. 15 shows a circuit diagram of the sharing pixel structure adopted in the solid-state imaging device 201.

The solid-state imaging device 201 adopts a sharing pixel structure in which a total of eight pixels, which are four pixels arranged in each one column and two pixels arranged in each row, share some pixel transistors, as shown in FIG. 15.

Specifically, each pixel individually includes only a photodiode PD, and a transfer transistor TG that transfers the electric charge stored in the photodiode PD. Meanwhile, a FD 221, a reset transistor 222, an amplification transistor 223, and a selection transistor 224 are shared by the eight pixels forming a sharing unit.

Note that, in the description below, the reset transistor 222, the amplification transistor 223, and the selection transistor 224, which are shared by the eight pixels forming a sharing unit, will be also referred to as the shared pixel transistors among the pixel transistors. Further, to distinguish the photodiodes PD and the transfer transistors TG disposed in the respective eight pixels in the sharing unit, the photodiodes PD and the transfer transistors TG will be referred to as the photodiodes PD1 through PD8 and the transfer transistors TG1 through TG8, as shown in FIG. 15.

Each of the photodiodes PD1 through PD8 receives light, and then generates and stores photocharge.

When a drive signal supplied to the gate electrode of the transfer transistor TG1 via a signal line TG1A enters an active state, the transfer transistor TG1 enters a conductive state, to transfer the photocharge stored in the photodiode PD1 to the FD 221. When a drive signal supplied to the gate electrode of the transfer transistor TG2 via a signal line TG2A enters an active state, the transfer transistor TG2 enters a conductive state, to transfer the photocharge stored in the photodiode PD2 to the FD 221. When a drive signal supplied to the gate electrode of the transfer transistor TG3 via a signal line TG3A enters an active state, the transfer transistor TG3 enters a conductive state, to transfer the photocharge stored in the photodiode PD3 to the FD 221. When a drive signal supplied to the gate electrode of the transfer transistor TG4 via a signal line TG4A enters an active state, the transfer transistor TG4 enters a conductive state, to transfer the photocharge stored in the photodiode PD4 to the FD 221. The photodiodes PD5 through PD8 and the transfer transistors TG5 through TG8 operate in a manner similar to the photodiodes PD1 through PD4 and the transfer transistors TG1 through TG4.

The FD 221 temporarily holds the photocharges supplied from the photodiodes PD1 through PD8.

When a drive signal supplied to the gate electrode of the reset transistor 222 via a signal line RST enters an active state, the reset transistor 222 enters a conductive state, to reset the potential of the FD 221 to a predetermined level (reset voltage VDD).

The amplification transistor 223 has its source electrode connected to the vertical signal line 209 via the selection transistor 224, to form a source follower circuit together with the load MOS of a constant-current source circuit unit (not shown) connected to one end of the vertical signal line 209.

The selection transistor 224 is connected between the source electrode of the amplification transistor 223 and the vertical signal line 209. When a selection signal supplied to the gate electrode of the selection transistor 224 via a signal line SEL enters an active state, the selection transistor 224 enters a conductive state, to put the sharing unit into a selected state, and output pixel signals that are output from the amplification transistor 223 and are of the pixels in the sharing unit to the vertical signal line 209. The plurality of pixels in the sharing unit can output pixel signals pixel by pixel, or simultaneously output pixel signals on a pixel unit basis, in accordance with a drive signal from the vertical drive circuit 204.

Figure 16B:
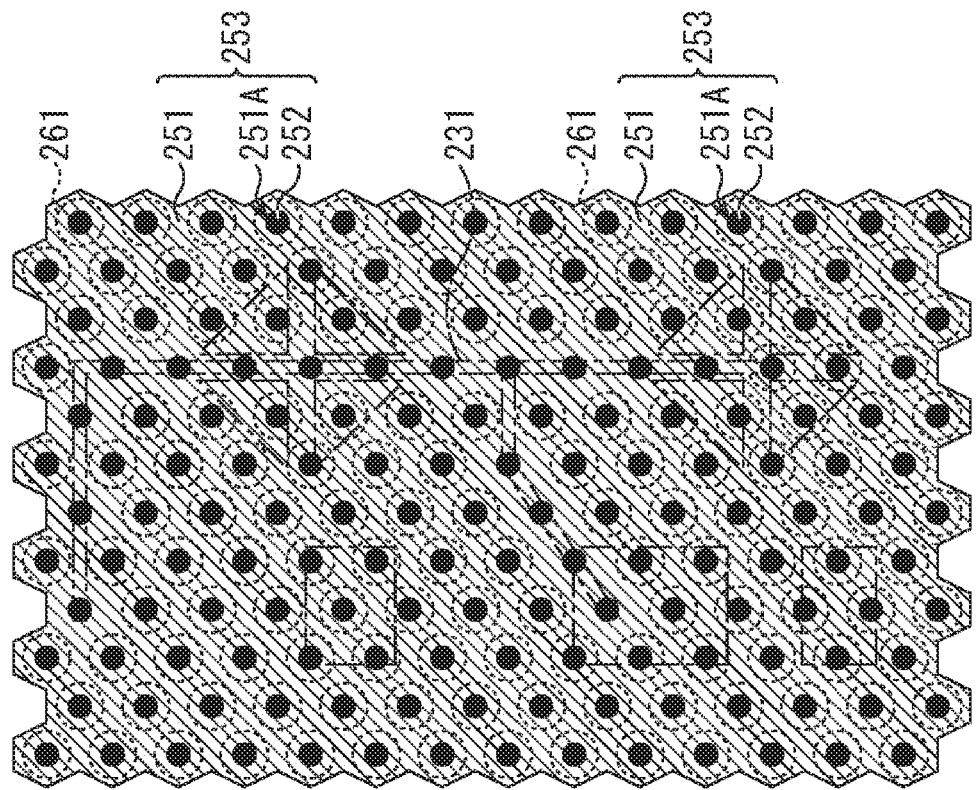
FIGS. 16A and 16B are plan views showing the pixel layout of the sharing pixel structure.
Figure 16A:
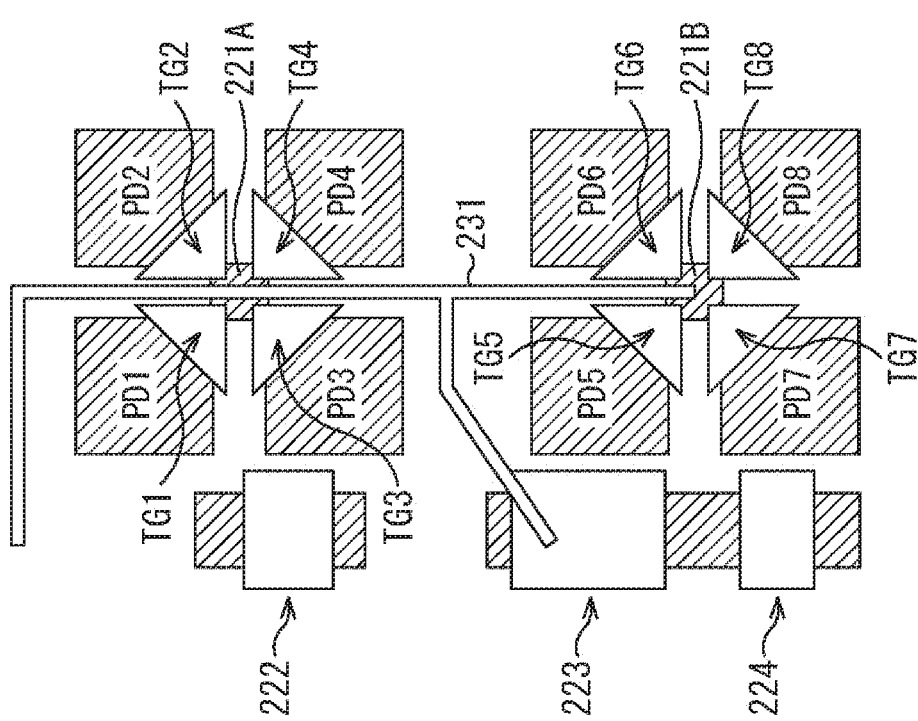

FIG. 16A is a plan view showing the pixel layout in the sharing pixel structure shown in FIG. 15. In FIG. 16A, the components corresponding to those shown in FIG. 15 are denoted by the same reference numerals used in FIG. 15.

As shown in FIGS. 16A and 16B, for example, the pixel layout of the sharing pixel structure has a configuration in which photodiodes PD and transfer transistors TG are provided for the respective pixels arranged in a 2×2 array, two of such structures are arranged in a vertical direction (the column direction), and the shared pixel transistors are disposed on the left side of the two structures.

More specifically, the photodiodes PD1 through PD4 are provided for the respective pixels in the upper 2×2 array region, and a FD 221A is disposed at the center of the 2×2 photodiodes PD1 through PD4. Further, (the gate electrodes of) the transfer transistors TG1 through TG4 provided for the respective pixels are disposed in the vicinities of the respective photodiodes PD1 through PD4 and the FD 221A. The reset transistor 222, which is a shared pixel transistor, is disposed on the left side of the upper 2×2 array region.

The photodiodes PD5 through PD8 are provided for the respective pixels in the lower 2×2 array region, and a FD 221B is disposed at the center of the 2×2 photodiodes PD5 through PD8. Further, (the gate electrodes of) the transfer transistors TG5 through TG8 provided for the respective pixels are disposed in the vicinities of the respective photodiodes PD5 through PD8 and the FD 221B. The amplification transistor 223 and the selection transistor 224, which are shared pixel transistors, are disposed on the left side of the lower 2×2 array region.

The FD 221A in the center of the upper 2×2 array region and the FD 221B in the center of the lower 2×2 array region are connected by a metallic wiring line 231, and are also connected to the gate electrode of the amplification transistor 223. The FD 221 in FIG. 15 corresponds to the two FDs 221A and 221B.

B of FIG. 16 is a plan view of a wiring layer, and a diffusion preventing film formed on the wiring layer. The wiring layer is formed by applying the air gap structure described above to a wiring layer in which the metallic wiring line 231 shown in A of FIG. 16, the gate electrodes of the transfer transistors TG1 through TG8, and the gate electrodes of the shared pixel transistors are formed.

FIG. 16B is a plan view of a wiring layer, and a diffusion preventing film formed on the wiring layer. The wiring layer is formed by applying the air gap structure described above to a wiring layer in which the metallic wiring line 231 shown in FIG. 16A, the gate electrodes of the transfer transistors TG1 through TG8, and the gate electrodes of the shared pixel transistors are formed.

In FIG. 16B, the gate electrodes of the transfer transistors TG, the gate electrodes of the shared pixel transistors, and the metallic wiring line 231, which are indicated by dot-and-dash lines, are formed in the layer under a diffusion preventing film 253 formed by burying a second film 252 in a large number of holes 251A formed in a first film 251. Since no air gaps are formed in the region in which the metallic wiring line 231 and the holes 251A overlap, a protective film 261 formed around the air gaps is not formed in the region. The protective film 261 is indicated by dashed lines, and the air gaps are formed on the inner side thereof.

(Example Configuration of the Substrate of the Solid-State Imaging Device)

Figure 17A:
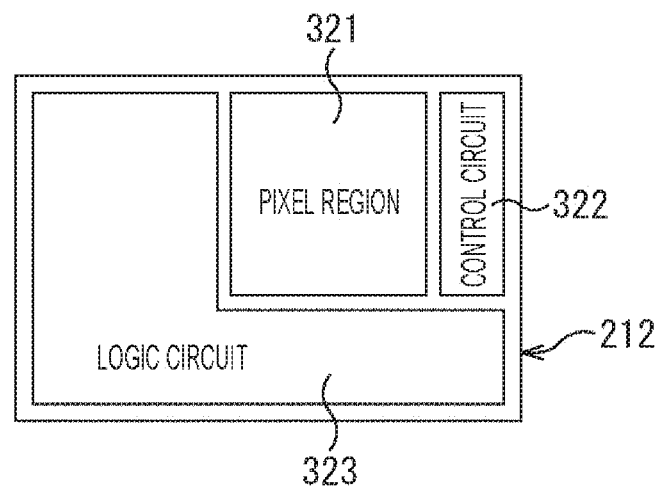
FIGS. 17A, 17B, and 17C are diagrams showing example substrate configurations of the solid-state imaging device shown in FIG. 14.

As shown in FIG. 17A, the solid-state imaging device 201 in FIG. 14 has a structure in which a pixel region 321 having a plurality of pixels 202 arranged therein, a control circuit 322 that controls the pixels 202, and a logic circuit 323 including a signal processing circuit for pixels signals are formed on the single semiconductor substrate 212. In this case, the air gap structure of the present technology can be formed over the entire surfaces of the wiring layers of the single semiconductor substrate 212. The pixel region 321 is the region corresponding to the pixel region 203 in FIG. 14.

Figure 17B:
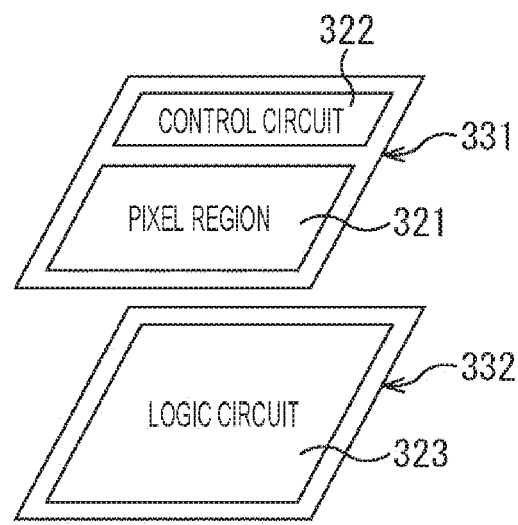

Alternatively, as shown in FIG. 17B, the solid-state imaging device 201 may have a configuration in which a first semiconductor substrate 331 having the pixel region 321 and the control circuit 322 formed therein, and a second semiconductor substrate 332 having the logic circuit 323 formed therein are stacked. The first semiconductor substrate 331 and the second semiconductor substrate 332 are electrically connected to each other by through silicon vias (TSVs) or Cu-Cu metal joining, for example. In this case, the air gap structure of the present technology can be formed over the entire surfaces of the respective wiring layers of the first semiconductor substrate 331 and the second semiconductor substrate 332.

Figure 17C:
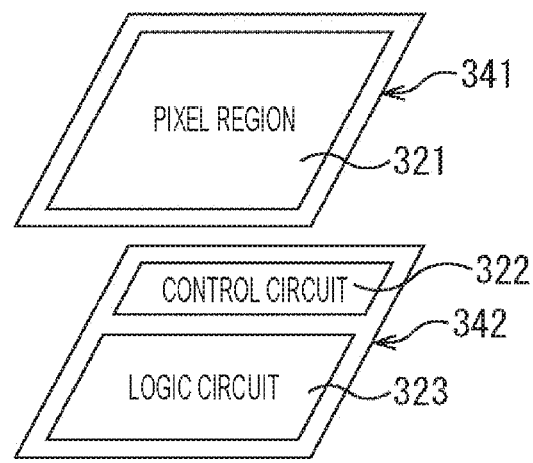

Alternatively, as shown in FIG. 17C, the solid-state imaging device 201 may have a configuration in which a first semiconductor substrate 341 having only the pixel region 321 formed therein, and a second semiconductor substrate 342 having the control circuit 322 and the logic circuit 323 formed therein are stacked. The first semiconductor substrate 341 and the second semiconductor substrate 342 are electrically connected by through vias or a Cu-Cu metal joining, for example. In this case, the air gap structure of the present technology can be formed over the entire surfaces of the respective wiring layers of the first semiconductor substrate 341 and the second semiconductor substrate 342.

Further, the air gap structure of the present technology may be formed over the entire surface of the wiring layer of a semiconductor substrate. However, the air gap structure may not be formed in some region, as in the third embodiment described with reference to FIG. 8.

(Examples of No-Air-Gap Formation Regions)

Examples in which the air gap structure is not formed in part of the wiring layer region are now described by way of an example of the solid-state imaging device 201 using the single semiconductor substrate 212 shown in FIG. 17A.

Figure 18A:
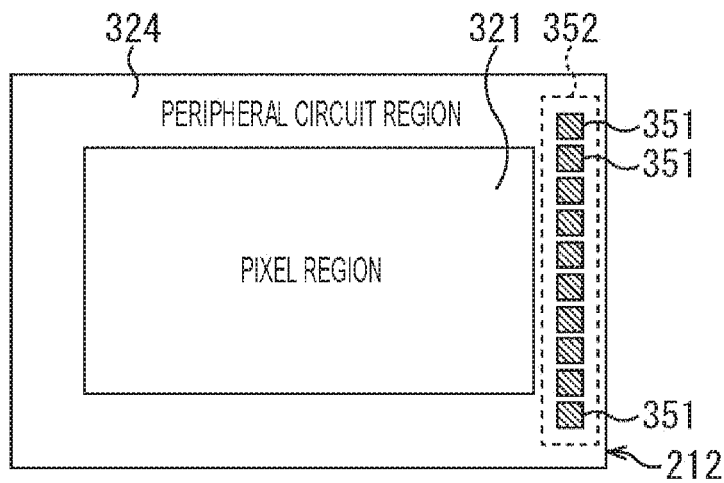
FIGS. 18A, 18B, and 18C are diagrams showing examples of no-air-gap formation regions.
Figure 18B:
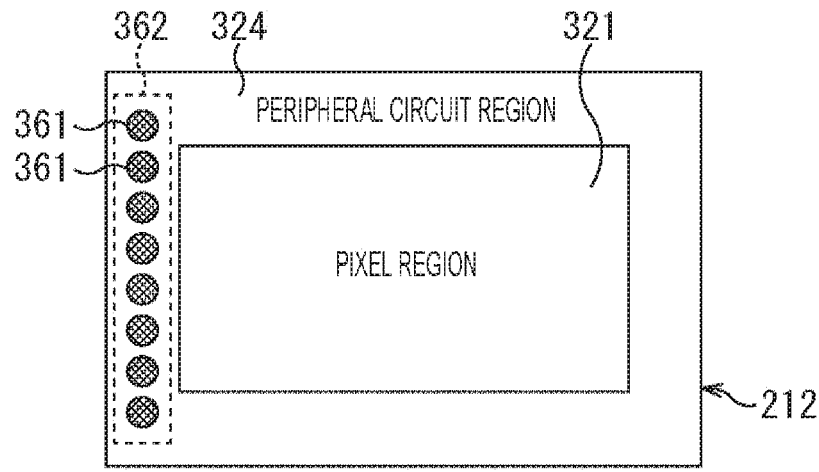
Figure 18C:
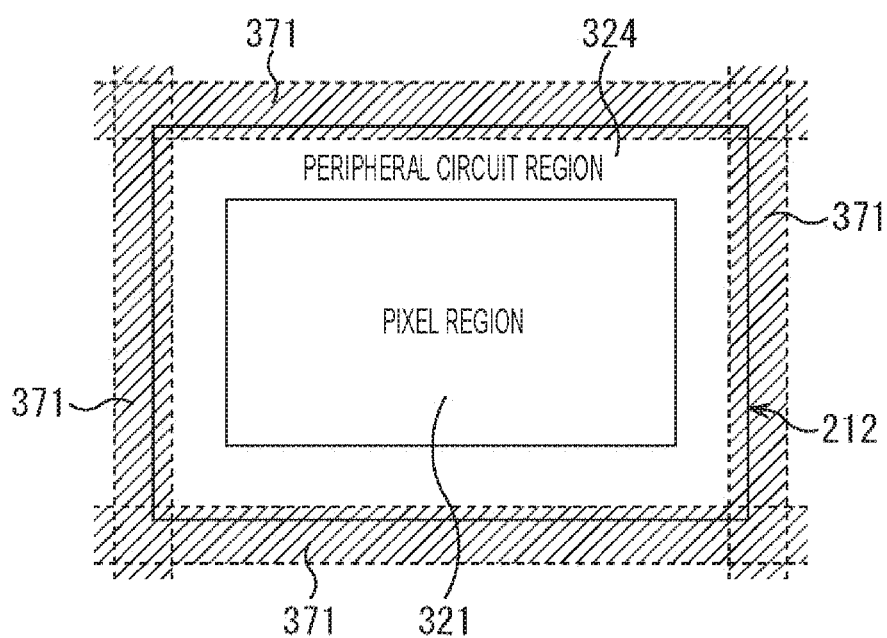

FIGS. 18A, 18B, and 18C show three examples of no-air-gap formation regions in cases where the air gap structure is not formed in part of the wiring layer region in the solid-state imaging device 201.

FIG. 18A shows an example in which the region having electrode pads formed therein is the no-air-gap formation region.

That is, in FIG. 18A, the single semiconductor substrate 212 is formed with the pixel region 321 in which a plurality of pixels 202 are arranged, and a peripheral circuit region 324 including the control circuit 322 and the logic circuit 323. An electrode pad region 352 that is formed in the peripheral circuit region 324 and has a plurality of electrode pads 351 formed therein can be set as the no-air-gap formation region.

FIG. 18B shows an example in which the region having through vias formed therein is the no-air-gap formation region.

That is, in FIG. 18B, the single semiconductor substrate 212 is also formed with the pixel region 321 in which a plurality of pixels 202 are arranged, and the peripheral circuit region 324 including the control circuit 322 and the logic circuit 323. A through via region 362 that is formed in the peripheral circuit region 324 and has a plurality of through vias 361 formed therein can be set as the no-air-gap formation region.

FIG. 18C shows an example in which the dicing region is the no-air-gap formation region.

That is, in FIG. 18C, the single semiconductor substrate 212 is also formed with the pixel region 321 in which a plurality of pixels 202 are arranged, and the peripheral circuit region 324 including the control circuit 322 and the logic circuit 323. Of the peripheral circuit region 324, a dicing region 371 that is the region to be removed when the semiconductor substrate 212 is diced with a blade or the like can be set as the no-air-gap formation region.

(Detailed Cross-Sectional View of a Solid-State Imaging Device)

Figure 19:
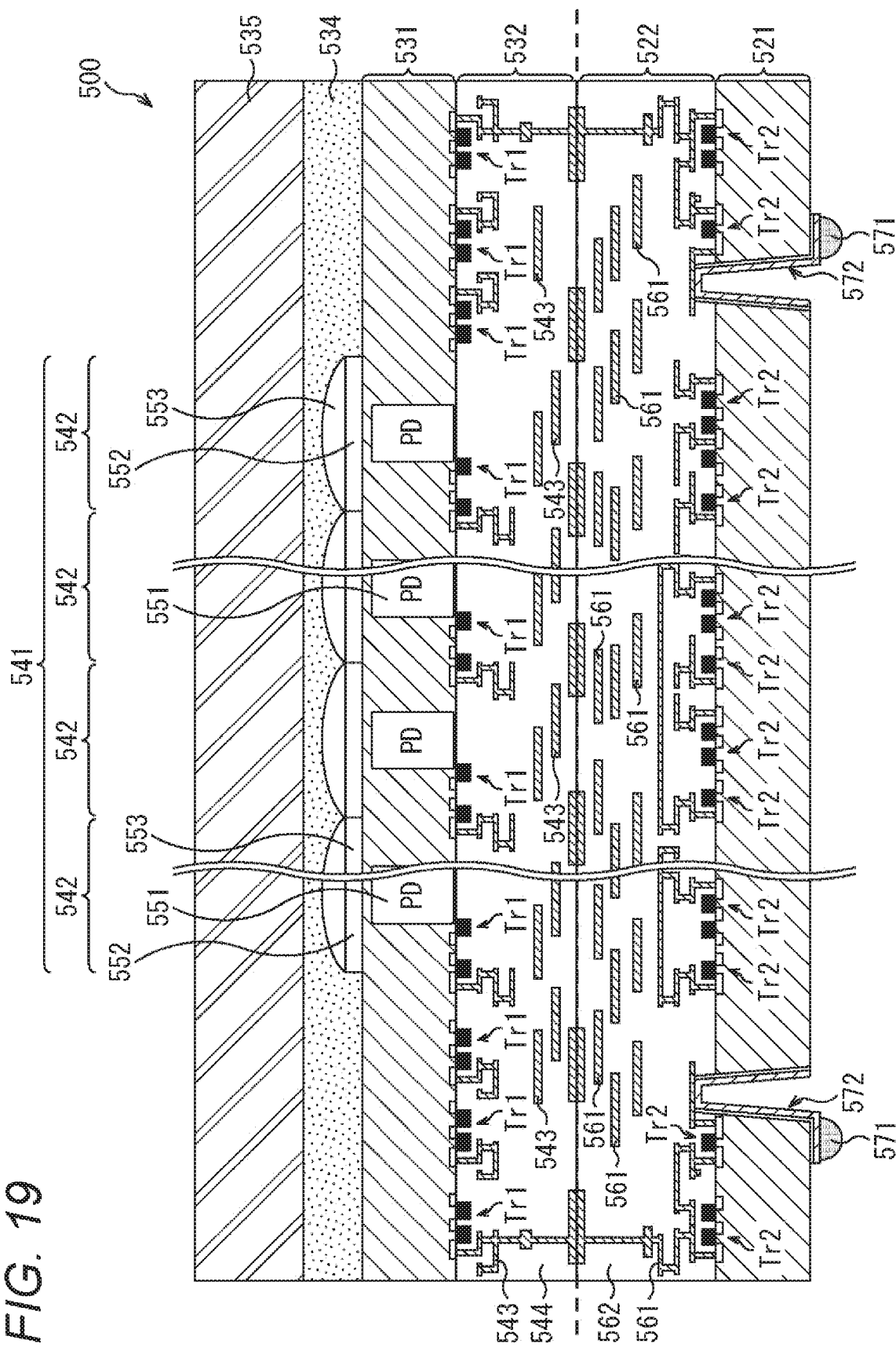
FIG. 19 is a cross-sectional view of a specific example configuration of a solid-state imaging device to which the present technology is applied.

FIG. 19 is a detailed cross-sectional view of a solid-state imaging device in a case where two semiconductor substrates are joined to each other as shown in B and C of FIGS. 17B and 17C.

In a solid-state imaging device 500 in FIG. 19, a wiring layer of a multilayer wiring layer 522 formed on a first semiconductor substrate 521 and a wiring layer of a multilayer wiring layer 532 formed on a second semiconductor substrate 531 are bonded to each other by wafer bonding.

The surface of light entrance to the solid-state imaging device 500 is the surface on the opposite side from the surface on which the multilayer wiring layer 532 of the second semiconductor substrate 531, which is the upper side in FIG. 19, is formed. In a pixel region 541 of the solid-state imaging device 500, pixels 542 are arranged in a matrix.

On the upper surface of the second semiconductor substrate 531, which is the surface of light entrance, color filters 552 of red (R), green (G), or blue (B), and on-chip lenses 553 are formed for the respective pixels, for example. In the second semiconductor substrate 531 under the color filters 552, photodiodes (PDs) 551 that are photoelectric conversion elements using P-N junctions are formed for the respective pixels.

On the upper side of the on-chip lenses 553 formed on the light entrance surface of the second semiconductor substrate 531, a protective substrate 535 for protecting the structures in the solid-state imaging device 500, particularly the on-chip lenses 553 and the color filters 552, is disposed via a sealing resin 534. The protective substrate 535 is a transparent glass substrate, for example.

The multilayer wiring layer 532 formed on the lower surface of the second semiconductor substrate 531 includes a plurality of wiring layers 543 and an interlayer insulating film 544 formed between the wiring layers 543. A large number of transistors Tr1 are formed at the interface between the multilayer wiring layer 532 and the second semiconductor substrate 531. These transistors Tr1 are transistors that control photoelectric conversion operations and operations of reading photoelectrically converted electrical signals, or transistors forming signal processing circuits or the like, for example.

Meanwhile, the multilayer wiring layer 522 of the first semiconductor substrate 521, which faces and is joined to the multilayer wiring layer 532 of the second semiconductor substrate 531, includes a plurality of wiring layers 561 and an interlayer insulating film 562 formed between the wiring layers 561. A large number of transistors Tr2 forming logic circuits are also formed at the interface between the multilayer wiring layer 522 and the first semiconductor substrate 521.

On the surface on the opposite side from the surface on which the multilayer wiring layer 522 of the first semiconductor substrate 521, which is the lower side in FIG. 19, a plurality of external terminals 571 is formed, and the external terminals 571 are connected to predetermined wiring layers 561 of the multilayer wiring layer 522 via through vias 572 penetrating the first semiconductor substrate 521. The external terminals 571 are formed with solder balls, for example, and receive power supply from outside, and perform signal inputs/outputs.

The wiring layer 561 closest to the opposing multilayer wiring layer 532 in the multilayer wiring layer 522 formed on the first semiconductor substrate 521, and the wiring layer 543 closest to the opposing multilayer wiring layer 522 in the multilayer wiring layer 532 formed on the second semiconductor substrate 531 are joined to each other by Cu—Cu metal joining, for example.

The air gap structure described above is adopted for one or more wiring layers 561 of the multilayer wiring layer 522 of the solid-state imaging device 500 formed by joining two semiconductor substrates (the first semiconductor substrate 521 and the second semiconductor substrate 531) as described above, and for one or more wiring layers 543 of the multilayer wiring layer 532. Note that, in the solid-state imaging device 500 in FIG. 19, Cu—Cu metal joining is used in the electrical connection between the two semiconductor substrates. However, through vias or the like may be used.

7. Example Application to an Endoscopic Surgery System

The technology (the present technology) according to the present disclosure can be applied to various products. For example, the technology according to the present disclosure may be applied to an endoscopic surgery system.

Figure 20:
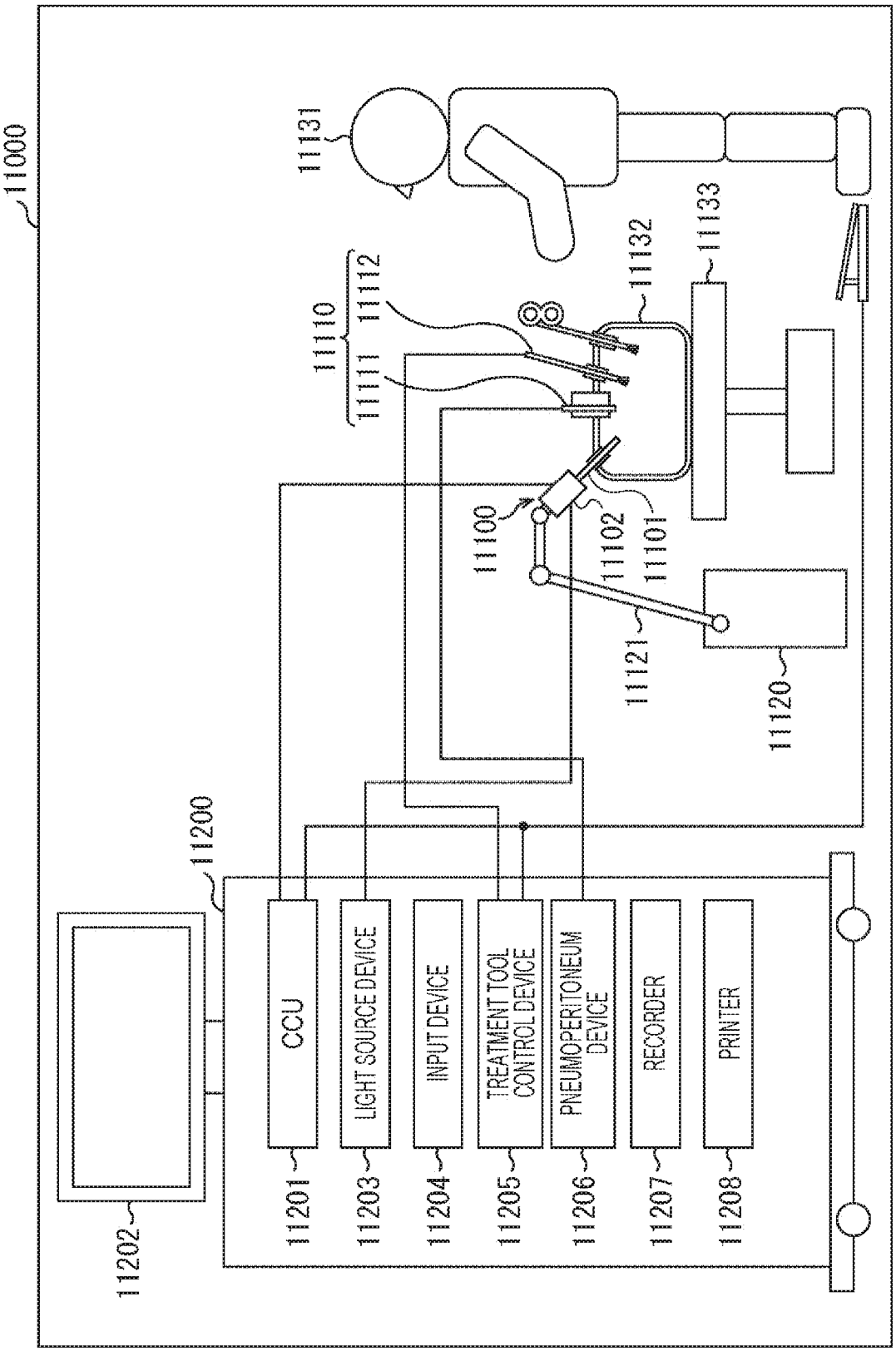
FIG. 20 is a diagram schematically showing an example configuration of an endoscopic surgery system.

FIG. 20 is a diagram schematically showing an example configuration of an endoscopic surgery system to which the technology (the present technology) according to the present disclosure may be applied.

FIG. 20 shows a situation where a surgeon (a physician) 11131 is performing surgery on a patient 11132 on a patient bed 11133, using an endoscopic surgery system 11000. As shown in the drawing, the endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various kinds of devices for endoscopic surgery are mounted.

The endoscope 11100 includes a lens barrel 11101 that has a region of a predetermined length from the top end to be inserted into a body cavity of the patient 11132, and a camera head 11102 connected to the base end of the lens barrel 11101. In the example shown in the drawing, the endoscope 11100 is designed as a so-called rigid scope having a rigid lens barrel 11101. However, the endoscope 11100 may be designed as a so-called flexible scope having a flexible lens barrel.

At the top end of the lens barrel 11101, an opening into which an objective lens is inserted is provided. A light source device 11203 is connected to the endoscope 11100, and the light generated by the light source device 11203 is guided to the top end of the lens barrel by a light guide extending inside the lens barrel 11101, and is emitted toward the current observation target in the body cavity of the patient 11132 via the objective lens. Note that the endoscope 11100 may be a forward-viewing endoscope, an oblique-viewing endoscope, or a side-viewing endoscope.

An optical system and an imaging device are provided inside the camera head 11102, and reflected light (observation light) from the current observation target is converged on the imaging device by the optical system. The observation light is photoelectrically converted by the imaging device, and an electrical signal corresponding to the observation light, which is an image signal corresponding to the observation image, is generated. The image signal is transmitted as RAW data to a camera control unit (CCU) 11201.

The CCU 11201 is formed with a central processing unit (CPU), a graphics processing unit (GPU), or the like, and collectively controls operations of the endoscope 11100 and a display device 11202. Further, the CCU 11201 receives an image signal from the camera head 11102, and subjects the image signal to various kinds of image processing, such as a development process (demosaicing process), for example, to display an image based on the image signal.

Under the control of the CCU 11201, the display device 11202 displays an image based on the image signal subjected to the image processing by the CCU 11201.

The light source device 11203 is formed with a light source such as a light emitting diode (LED), for example, and supplies the endoscope 11100 with illuminating light for imaging the surgical site or the like.

An input device 11204 is an input interface to the endoscopic surgery system 11000. The user can input various kinds of information and instructions to the endoscopic surgery system 11000 via the input device 11204. For example, the user inputs an instruction or the like to change imaging conditions (such as the type of illuminating light, the magnification, and the focal length) for the endoscope 11100.

A treatment tool control device 11205 controls driving of the energy treatment tool 11112 for tissue cauterization, incision, blood vessel sealing, or the like. A pneumoperitoneum device 11206 injects a gas into a body cavity of the patient 11132 via the pneumoperitoneum tube 11111 to inflate the body cavity, for the purpose of securing the field of view of the endoscope 11100 and the working space of the surgeon. A recorder 11207 is a device capable of recording various kinds of information about the surgery. A printer 11208 is a device capable of printing various kinds of information relating to the surgery in various formats such as text, images, graphics, and the like.

Note that the light source device 11203 that supplies the endoscope 11100 with the illuminating light for imaging the surgical site can be formed with an LED, a laser light source, or a white light source that is a combination of an LED and a laser light source, for example. In a case where a white light source is formed with a combination of RGB laser light sources, the output intensity and the output timing of each color (each wavelength) can be controlled with high precision. Accordingly, the white balance of an image captured by the light source device 11203 can be adjusted. Alternatively, in this case, laser light from each of the RGB laser light sources may be emitted onto the current observation target in a time-division manner, and driving of the imaging device of the camera head 11102 may be controlled in synchronization with the timing of the light emission. Thus, images corresponding to the respective RGB colors can be captured in a time-division manner. According to the method, a color image can be obtained without any color filter provided in the imaging device.

Further, the driving of the light source device 11203 may also be controlled so that the intensity of light to be output is changed at predetermined time intervals. The driving of the imaging device of the camera head 11102 is controlled in synchronism with the timing of the change in the intensity of the light, and images are acquired in a time-division manner and are then combined. Thus, a high dynamic range image with no black portions and no white spots can be generated.

Further, the light source device 11203 may also be designed to be capable of supplying light of a predetermined wavelength band compatible with special light observation. In special light observation, light of a narrower band than the illuminating light (or white light) at the time of normal observation is emitted, with the wavelength dependence of light absorption in body tissue being taken advantage of, for example. As a result, so-called narrow band imaging is performed to image predetermined tissue such as a blood vessel in a mucosal surface layer or the like with high contrast. Alternatively, in the special light observation, fluorescence observation for obtaining an image with fluorescence generated through emission of excitation light may be performed. In fluorescence observation, excitation light is emitted to body tissue so that the fluorescence from the body tissue can be observed (autofluorescence observation). Alternatively, a reagent such as indocyanine green (ICG) is locally injected into body tissue, and excitation light corresponding to the fluorescence wavelength of the reagent is emitted to the body tissue so that a fluorescent image can be obtained, for example. The light source device 11203 can be designed to be capable of suppling narrowband light and/or excitation light compatible with such special light observation.

Figure 21:
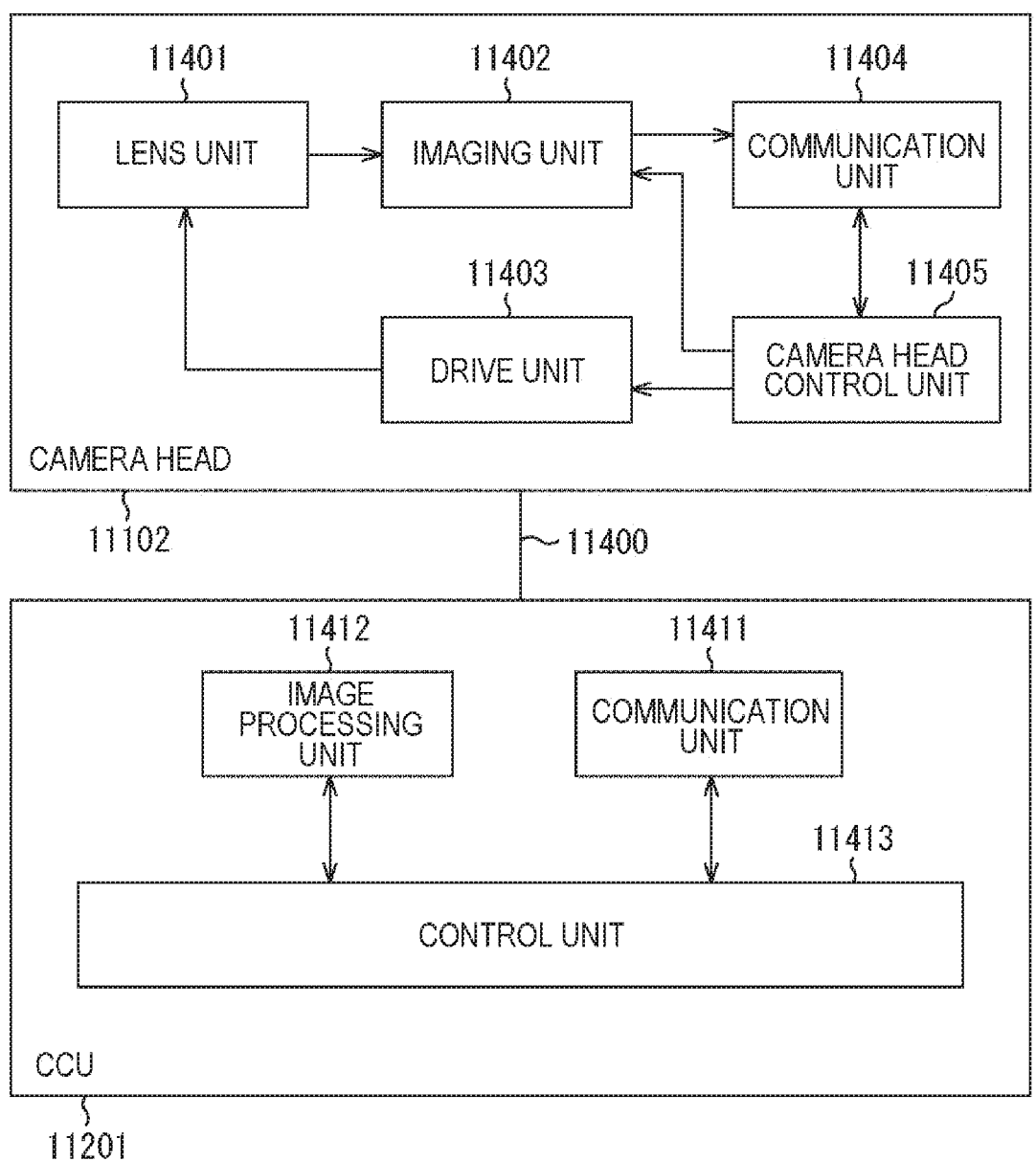
FIG. 21 is a block diagram showing an example of the functional configurations of a camera head and a CCU.

FIG. 21 is a block diagram showing an example of the functional configurations of the camera head 11102 and the CCU 11201 shown in FIG. 20.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at the connecting portion with the lens barrel 11101. Observation light captured from the top end of the lens barrel 11101 is guided to the camera head 11102, and enters the lens unit 11401. The lens unit 11401 is formed with a combination of a plurality of lenses including a zoom lens and a focus lens.

The imaging unit 11402 is formed with an imaging device. The imaging unit 11402 may be formed with one imaging device (a so-called single-plate type), or may be formed with a plurality of imaging devices (a so-called multiple-plate type). In a case where the imaging unit 11402 is of a multiple-plate type, for example, image signals corresponding to the respective RGB colors may be generated by the respective imaging devices, and be then combined to obtain a color image. Alternatively, the imaging unit 11402 may be designed to include a pair of imaging devices for acquiring right-eye and left-eye image signals compatible with three-dimensional (3D) display. As the 3D display is conducted, the surgeon 11131 can grasp more accurately the depth of the body tissue at the surgical site. Note that, in a case where the imaging unit 11402 is of a multiple-plate type, a plurality of lens units 11401 are provided for the respective imaging devices.

Further, the imaging unit 11402 is not necessarily provided in the camera head 11102. For example, the imaging unit 11402 may be provided immediately behind the objective lens in the lens barrel 11101.

The drive unit 11403 is formed with an actuator, and, under the control of the camera head control unit 11405, moves the zoom lens and the focus lens of the lens unit 11401 by a predetermined distance along the optical axis. With this arrangement, the magnification and the focal point of the image captured by the imaging unit 11402 can be appropriately adjusted.

The communication unit 11404 is formed with a communication device for transmitting and receiving various kinds of information to and from the CCU 11201. The communication unit 11404 transmits the image signal obtained as RAW data from the imaging unit 11402 to the CCU 11201 via the transmission cable 11400.

Further, the communication unit 11404 also receives a control signal for controlling the driving of the camera head 11102 from the CCU 11201, and supplies the control signal to the camera head control unit 11405. The control signal includes information about imaging conditions, such as information for specifying the frame rate of captured images, information for specifying the exposure value at the time of imaging, and/or information for specifying the magnification and the focal point of captured images, for example.

Note that the above imaging conditions such as the frame rate, the exposure value, the magnification, and the focal point may be appropriately specified by the user, or may be automatically set by the control unit 11413 of the CCU 11201 on the basis of an acquired image signal. In the latter case, the endoscope 11100 has a so-called auto-exposure (AE) function, an auto-focus (AF) function, and an auto-white-balance (AWB) function.

The camera head control unit 11405 controls the driving of the camera head 11102, on the basis of a control signal received from the CCU 11201 via the communication unit 11404.

The communication unit 11411 is formed with a communication device for transmitting and receiving various kinds of information to and from the camera head 11102. The communication unit 11411 receives an image signal transmitted from the camera head 11102 via the transmission cable 11400.

Further, the communication unit 11411 also transmits a control signal for controlling the driving of the camera head 11102, to the camera head 11102. The image signal and the control signal can be transmitted through electrical communication, optical communication, or the like.

The image processing unit 11412 performs various kinds of image processing on an image signal that is RAW data transmitted from the camera head 11102.

The control unit 11413 performs various kinds of control relating to display of an image of the surgical site or the like captured by the endoscope 11100, and a captured image obtained through imaging of the surgical site or the like. For example, the control unit 11413 generates a control signal for controlling the driving of the camera head 11102.

Further, the control unit 11413 also causes the display device 11202 to display a captured image showing the surgical site or the like, on the basis of the image signal subjected to the image processing by the image processing unit 11412. In doing so, the control unit 11413 may recognize the respective objects shown in the captured image, using various image recognition techniques. For example, the control unit 11413 can detect the shape, the color, and the like of the edges of an object shown in the captured image, to recognize the surgical tool such as forceps, a specific body site, bleeding, the mist at the time of use of the energy treatment tool 11112, and the like. When causing the display device 11202 to display the captured image, the control unit 11413 may cause the display device 11202 to superimpose various kinds of surgery aid information on the image of the surgical site on the display, using the recognition result. As the surgery aid information is superimposed and displayed, and thus, is presented to the surgeon 11131, it becomes possible to reduce the burden on the surgeon 11131, and enable the surgeon 11131 to proceed with the surgery in a reliable manner.

The transmission cable 11400 connecting the camera head 11102 and the CCU 11201 is an electrical signal cable compatible with electric signal communication, an optical fiber compatible with optical communication, or a composite cable thereof.

Here, in the example shown in the drawing, communication is performed in a wired manner using the transmission cable 11400. However, communication between the camera head 11102 and the CCU 11201 may be performed in a wireless manner.

An example of an endoscopic surgery system to which the technique according to the present disclosure can be applied has been described above. The technology according to the present disclosure may be applied to the imaging unit 11402 of the camera head 11102 in the configuration described above, for example. Specifically, the solid-state imaging device 201 or 500 having the air gap structure described above can be used as the imaging unit 11402. As the technology according to the present disclosure is applied to the imaging unit 11402, the wiring capacitance of the wiring layers can be reduced, and high-speed and high-quality surgical site images can be obtained.

Note that the endoscopic surgery system has been described as an example herein, but the technology according to the present disclosure may be applied to a microscopic surgery system or the like, for example.

8. Example Applications to Moving Objects

The technology (the present technology) according to the present disclosure can be applied to various products. For example, the technology according to the present disclosure may be embodied as a device mounted on any type of moving object, such as an automobile, an electrical vehicle, a hybrid electrical vehicle, a motorcycle, a bicycle, a personal mobility device, an airplane, a drone, a vessel, or a robot.

Figure 22:
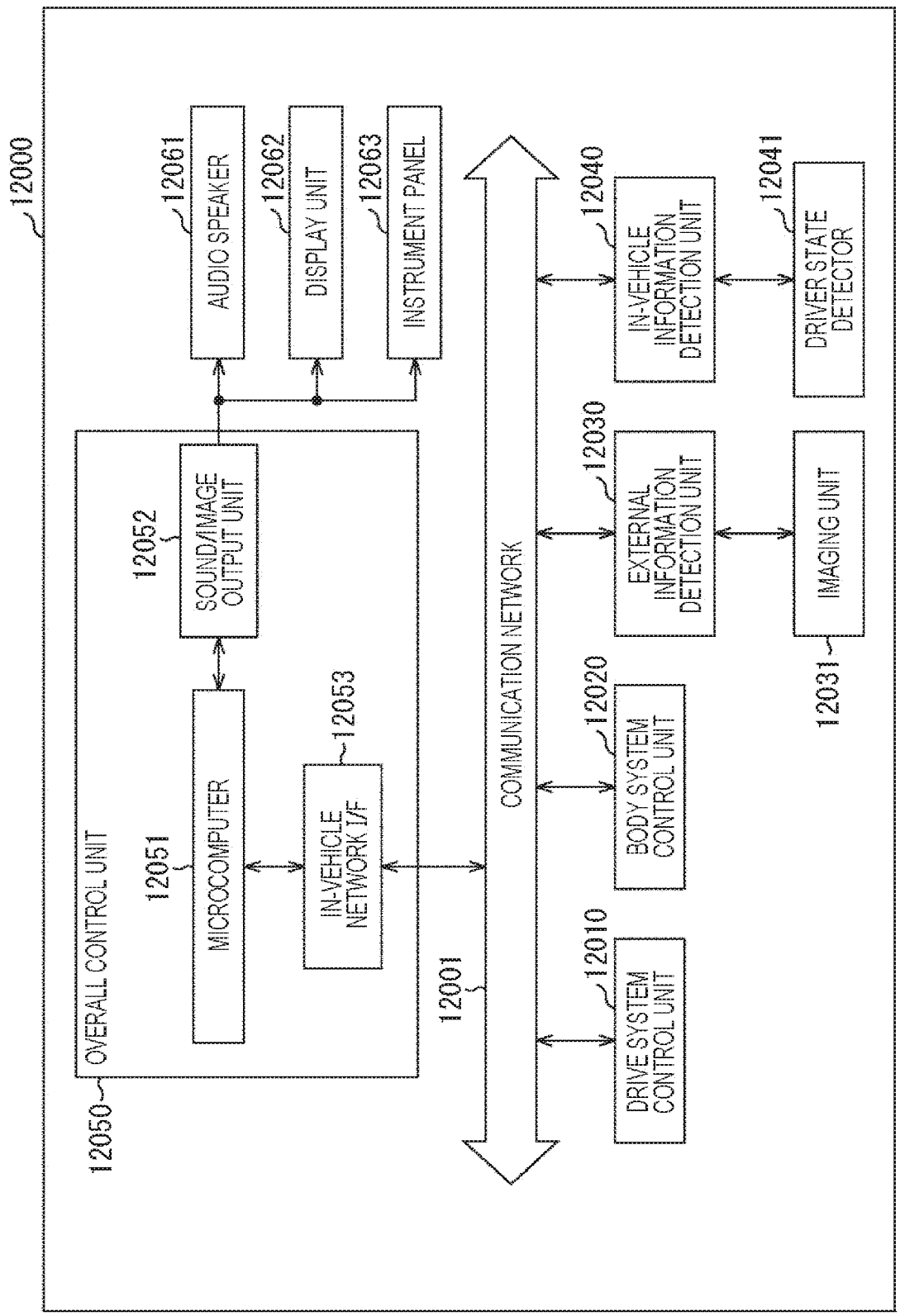
FIG. 22 is a block diagram schematically showing an example configuration of a vehicle control system.

FIG. 22 is a block diagram schematically showing an example configuration of a vehicle control system that is an example of a moving object control system to which the technology according to the present disclosure may be applied.

A vehicle control system 12000 includes a plurality of electronic control units connected via a communication network 12001. In the example shown in FIG. 22, the vehicle control system 12000 includes a drive system control unit 12010, a body system control unit 12020, an external information detection unit 12030, an in-vehicle information detection unit 12040, and an overall control unit 12050. Further, a microcomputer 12051, a sound/image output unit 12052, and an in-vehicle network interface (I/F) 12053 are also shown as the functional components of the overall control unit 12050.

The drive system control unit 12010 controls operations of the devices related to the drive system of the vehicle according to various programs. For example, the drive system control unit 12010 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle.

The body system control unit 12020 controls operations of the various devices mounted on the vehicle body according to various programs. For example, the body system control unit 12020 functions as a keyless entry system, a smart key system, a power window device, or a control device for various lamps such as a headlamp, a backup lamp, a brake lamp, a turn signal lamp, a fog lamp, or the like. In this case, the body system control unit 12020 can receive radio waves transmitted from a portable device that substitutes for a key, or signals from various switches. The body system control unit 12020 receives inputs of these radio waves or signals, and controls the door lock device, the power window device, the lamps, and the like of the vehicle.

The external information detection unit 12030 detects information outside the vehicle equipped with the vehicle control system 12000. For example, an imaging unit 12031 is connected to the external information detection unit 12030. The external information detection unit 12030 causes the imaging unit 12031 to capture an image of the outside of the vehicle, and receives the captured image. On the basis of the received image, the external information detection unit 12030 may perform an object detection process for detecting a person, a vehicle, an obstacle, a sign, characters on the road surface, or the like, or perform a distance detection process.

The imaging unit 12031 is an optical sensor that receives light, and outputs an electrical signal corresponding to the amount of received light. The imaging unit 12031 can output an electrical signal as an image, or output an electrical signal as distance measurement information. Further, the light to be received by the imaging unit 12031 may be visible light, or may be invisible light such as infrared rays.

The in-vehicle information detection unit 12040 detects information about the inside of the vehicle. For example, a driver state detector 12041 that detects the state of the driver is connected to the in-vehicle information detection unit 12040. The driver state detector 12041 includes a camera that captures an image of the driver, for example, and, on the basis of detected information input from the driver state detector 12041, the in-vehicle information detection unit 12040 may calculate the degree of fatigue or the degree of concentration of the driver, or determine whether the driver is dozing off.

On the basis of the external/internal information acquired by the external information detection unit 12030 or the in-vehicle information detection unit 12040, the microcomputer 12051 can calculate the control target value of the driving force generation device, the steering mechanism, or the braking device, and output a control command to the drive system control unit 12010. For example, the microcomputer 12051 can perform cooperative control to achieve the functions of an advanced driver assistance system (ADAS), including vehicle collision avoidance or impact mitigation, follow-up running based on the distance between vehicles, vehicle velocity maintenance running, vehicle collision warning, vehicle lane deviation warning, or the like.

Further, the microcomputer 12051 can also perform cooperative control to conduct automatic driving or the like for autonomously running not depending on the operation of the driver, by controlling the driving force generation device, the steering mechanism, the braking device, or the like on the basis of information about the surroundings of the vehicle, the information having being acquired by the external information detection unit 12030 or the in-vehicle information detection unit 12040.

Further, the microcomputer 12051 can also output a control command to the body system control unit 12020, on the basis of the external information acquired by the external information detection unit 12030. For example, the microcomputer 12051 controls the headlamp in accordance with the position of the leading vehicle or the oncoming vehicle detected by the external information detection unit 12030, and performs cooperative control to achieve an anti-glare effect by switching from a high beam to a low beam, or the like.

The sound/image output unit 12052 transmits an audio output signal and/or an image output signal to an output device that is capable of visually or audibly notifying the passenger(s) of the vehicle or the outside of the vehicle of information. In the example shown in FIG. 22, an audio speaker 12061, a display unit 12062, and an instrument panel 12063 are shown as output devices. The display unit 12062 may include an on-board display and/or a head-up display, for example.

Figure 23:
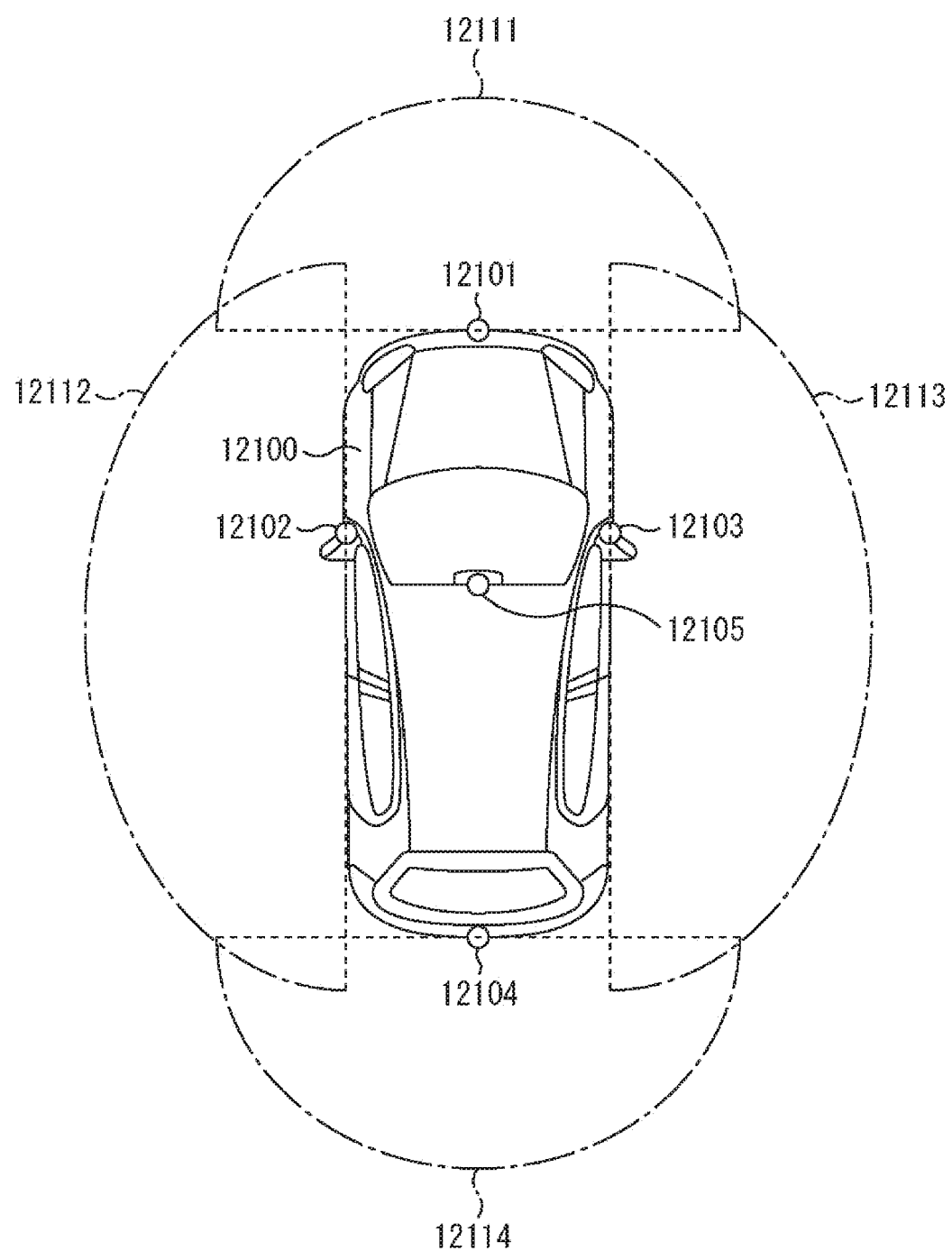
FIG. 23 is an explanatory diagram showing an example of installation positions of external information detectors and imaging units.

FIG. 23 is a diagram showing an example of installation positions of imaging units 12031.

In FIG. 23, a vehicle 12100 includes imaging units 12101, 12102, 12103, 12104, and 12105 as the imaging units 12031.

Imaging units 12101, 12102, 12103, 12104, and 12105 are provided at the following positions: the front end edge of a vehicle 12100, a side mirror, the rear bumper, a rear door, an upper portion of the front windshield inside the vehicle, and the like, for example. The imaging unit 12101 provided on the front end edge and the imaging unit 12105 provided on the upper portion of the front windshield inside the vehicle mainly capture images ahead of the vehicle 12100.

The imaging units 12102 and 12103 provided on the side mirrors mainly capture images on the sides of the vehicle 12100. The imaging unit 12104 provided on the rear bumper or a rear door mainly captures images behind the vehicle 12100. The front images acquired by the imaging units 12101 and 12105 are mainly used for detection of a vehicle running in front of the vehicle 12100, a pedestrian, an obstacle, a traffic signal, a traffic sign, a lane, or the like.

Note that FIG. 23 shows an example of the imaging ranges of the imaging units 12101 through 12104. An imaging range 12111 indicates the imaging range of the imaging unit 12101 provided on the front end edge, imaging ranges 12112 and 12113 indicate the imaging ranges of the imaging units 12102 and 12103 provided on the respective side mirrors, and an imaging range 12114 indicates the imaging range of the imaging unit 12104 provided on the rear bumper or a rear door. For example, image data captured by the imaging units 12101 through 12104 are superimposed on one another, so that an overhead image of the vehicle 12100 viewed from above is obtained.

At least one of the imaging units 12101 through 12104 may have a function of acquiring distance information. For example, at least one of the imaging units 12101 through 12104 may be a stereo camera including a plurality of imaging devices, or may be an imaging device having pixels for phase difference detection.

For example, on the basis of distance information obtained from the imaging units 12101 through 12104, the microcomputer 12051 calculates the distances to the respective three-dimensional objects within the imaging ranges 12111 through 12114, and temporal changes in the distances (the velocities relative to the vehicle 12100). In this manner, the three-dimensional object that is the closest three-dimensional object on the traveling path of the vehicle 12100 and is traveling at a predetermined velocity (0 km/h or higher, for example) in substantially the same direction as the vehicle 12100 can be extracted as the vehicle running in front of the vehicle 12100. Further, the microcomputer 12051 can set beforehand an inter-vehicle distance to be maintained in front of the vehicle running in front of the vehicle 12100, and can perform automatic brake control (including follow-up stop control), automatic acceleration control (including follow-up start control), and the like. In this manner, it is possible to perform cooperative control to conduct automatic driving or the like to autonomously travel not depending on the operation of the driver.

For example, on the basis of the distance information obtained from the imaging units 12101 through 12104, the microcomputer 12051 can extract three-dimensional object data concerning three-dimensional objects under the categories of two-wheeled vehicles, regular vehicles, large vehicles, pedestrians, utility poles, and the like, and use the three-dimensional object data in automatically avoiding obstacles. For example, the microcomputer 12051 classifies the obstacles in the vicinity of the vehicle 12100 into obstacles visible to the driver of the vehicle 12100 and obstacles difficult to visually recognize. The microcomputer 12051 then determines collision risks indicating the risks of collision with the respective obstacles. If a collision risk is equal to or higher than a set value, and there is a possibility of collision, the microcomputer 12051 can output a warning to the driver via the audio speaker 12061 and the display unit 12062, or can perform driving support for avoiding collision by performing forced deceleration or avoiding steering via the drive system control unit 12010.

At least one of the imaging units 12101 through 12104 may be an infrared camera that detects infrared rays. For example, the microcomputer 12051 can recognize a pedestrian by determining whether or not a pedestrian exists in images captured by the imaging units 12101 through 12104. Such pedestrian recognition is carried out through a process of extracting feature points from the images captured by the imaging units 12101 through 12104 serving as infrared cameras, and a process of performing a pattern matching on the series of feature points indicating the outlines of objects and determining whether or not there is a pedestrian, for example. If the microcomputer 12051 determines that a pedestrian exists in the images captured by the imaging units 12101 through 12104, and recognizes a pedestrian, the sound/image output unit 12052 controls the display unit 12062 to display a rectangular contour line for emphasizing the recognized pedestrian in a superimposed manner. Further, the sound/image output unit 12052 may also control the display unit 12062 to display an icon or the like indicating the pedestrian at a desired position.

An example of a vehicle control system to which the technology according to the present disclosure may be applied has been described above. The technology according to the present disclosure may be applied to the imaging unit 12031 in the configuration described above. Specifically, the solid-state imaging device 201 or 500 having the air gap structure described above can be used as the imaging unit 12031. As the technology according to the present disclosure is applied to the imaging unit 12031, the wiring capacitance of the wiring layers can be reduced, and high-speed and high-quality captured images can be obtained. Furthermore, with the obtained captured images, fatigue of the driver can be alleviated, and safety of the driver and the vehicle can be increased.

Embodiments of the present technology are not limited to the above described embodiments, and various modifications may be made to them without departing from the scope of the present technology.

For example, it is possible to adopt a combination of all or some of the above described plurality of embodiments.

Note that the advantageous effects described in this specification are merely examples, and the advantageous effects of the present technology are not limited to them and may include effects other than those described in this specification.

Note that the present technology may also be embodied in the configurations described below.

(1)

A semiconductor device including a first wiring layer and a second wiring layer including a metallic film, the first wiring layer and the second wiring layer being stacked via a diffusion preventing film that prevents diffusion of the metallic film, in which the diffusion preventing film includes a first film, and a second film buried in a large number of holes formed in the first film, at least the first wiring layer includes the metallic film, an air gap, and a protective film formed with the second film on an inner peripheral surface of the air gap, and an opening width of the air gap is equal to an opening width of the holes formed in the first film, or is greater than the opening width of the holes.

(2)

The semiconductor device according to (1), in which the first wiring layer has a plurality of the air gaps between two of the metallic films adjacent to each other.

(3)

The semiconductor device according to (1) or (2), in which the first wiring layer further includes an insulating film between two of the air gaps adjacent to each other.

(4)

The semiconductor device according to any one of (1) to (3), in which the first wiring layer has the air gap in an entire region between two of the metallic films adjacent to each other.

(5)

The semiconductor device according to any one of (1) to (4), in which the first wiring layer has a region in which the air gap is not formed but an insulating film is formed, between two of the metallic films adjacent to each other.

(6)

The semiconductor device according to (3) or (5), in which the first wiring layer further includes a protective film between the metallic film and the insulating film, and between the metallic film and the diffusion preventing film.

(7)

The semiconductor device according to (1), (4), or (6), in which the first wiring layer includes the air gap between two of the metallic films adjacent to each other, and a protective film formed with the second film on an inner peripheral surface of the air gap.

(8)

The semiconductor device according to any one of (1) to (7), in which the second wiring layer also includes the air gap, and the protective film formed with the second film on an inner peripheral surface of the air gap.

(9)

The semiconductor device according to any one of (1) to (8), in which the first film and the second film are films of the same material.

(10)

A method for manufacturing a semiconductor device, the method including:

forming a first film on an upper surface of a wiring layer in which a metallic film is formed, the first film serving as a diffusion preventing film that prevents diffusion of the metallic film;

forming a large number of holes in the first film;

forming an air gap in the wiring layer below the large number of holes, the air gap having a greater opening width than an opening width of the holes; and forming a second film on an inner peripheral surface of the air gap, and burying the second film in the large number of holes.

(11)

The method according to (10), in which a self-assembled film is applied onto an upper surface of the first film, and patterning is performed on the self-assembled film, to form the large number of holes.

(12)

The method according to (10) or (11), in which the first film having the large number of holes formed therein is used as a mask, and etching is performed on an insulating film of the wiring layer, to form the air gap in the insulating film below the large number of holes.

(13)

The method according to (12), in which etching is performed on the insulating film to form a groove having the same opening width as the opening width of the holes, with the first film having the large number of holes being used as a mask, and etching is further performed in the width direction, to make the opening width of the air gap greater than the opening width of the holes.

(14)

An electronic apparatus including a semiconductor device including a first wiring layer and a second wiring layer including a metallic film, the first wiring layer and the second wiring layer being stacked via a diffusion preventing film that prevents diffusion of the metallic film, in which the diffusion preventing film includes a first film, and a second film buried in a large number of holes formed in the first film, at least the first wiring layer includes an air gap, and a protective film formed with the second film on an inner peripheral surface of the air gap, and an opening width of the air gap is equal to an opening width of the holes formed in the first film, or is greater than the opening width of the holes.

REFERENCE SIGNS LIST

Semiconductor device
(11A to 11C) Wiring layer
12, 13 Diffusion preventing film
21 Insulating film
22 Metallic film
23 Barrier metal
24 Metallic wiring line
31 Insulating film
32 Metallic film
33 Barrier metal
34 Air gap
35 Protective film
36 Metallic wiring line
41 First film
42A Hole
42 Second film
51 Insulating film
52 Metallic film
53 Barrier metal
54 Metallic wiring line
71 Hard mask
72 DSA random pattern
75 Groove
91 Air gap
92 Protective film
111 Protective film
201 Solid-state imaging device
231 Metallic wiring line
251A Hole
251 First film
252 Second film
253 Diffusion preventing film
261 Protective film

The invention claimed is:

1. A semiconductor device, comprising:
 a first wiring layer and a second wiring layer,
  wherein each of the first wiring layer and the second wiring layer includes a metallic film; and
 a diffusion preventing film configured to prevent diffusion of the metallic film, wherein
  the diffusion preventing film is between the first wiring layer and the second wiring layer,
  the diffusion preventing film includes:
   a first film that includes a plurality of holes, and
   a second film in the plurality of holes in the first film, at least the first wiring layer further includes an air gap and a first protective film on an inner peripheral surface of the air gap, and an opening width of the air gap is one of equal to an opening width of a hole of the plurality of holes in the first film or greater than the opening width of the hole of the plurality of holes.

2. The semiconductor device according to claim 1, wherein
the first wiring layer further includes:
a plurality of air gaps, and
a plurality of metallic films, and
the plurality of air gaps is between two adjacent metallic films of the plurality of metallic films.

3. The semiconductor device according to claim 1, wherein the first wiring layer further includes:
a plurality of air gaps, and
an insulating film between two adjacent air gaps of the plurality of air gaps.

4. The semiconductor device according to claim 3, wherein
the first wiring layer further includes a second protective film between the metallic film and the insulating film, and
the second protective film is between the metallic film and the diffusion preventing film.

5. The semiconductor device according to claim 1, wherein
the first wiring layer further includes a plurality of metallic films, and
the air gap is in an entire region between two adjacent metallic films of the plurality of metallic films.

6. The semiconductor device according to claim 1, wherein
the first wiring layer further includes:
a region in which the air gap is absent,
a plurality of metallic films, and
an insulating film in the region, and
the region is between two adjacent metallic films of the plurality of metallic films.

7. The semiconductor device according to claim 1, wherein the first wiring layer further includes:
a plurality of metallic films,
wherein the air gap is between two adjacent metallic films of the plurality of metallic films, and
a second protective film on the inner peripheral surface of the air gap.

8. The semiconductor device according to claim 1, wherein the second wiring layer further includes:
the air gap, and
the first protective film on the inner peripheral surface of the air gap.

9. The semiconductor device according to claim 1, wherein the first film and the second film include the same material.

10. A method for manufacturing a semiconductor device, the method comprising:
forming a first film on an upper surface of a wiring layer, wherein
the wiring layer includes a metallic film, and
the first film serves as a diffusion preventing film that prevents diffusion of the metallic film;
applying a self-assembled film onto an upper surface of the first film;
performing patterning on the self-assembled film to form a plurality of holes in the first film;
forming an air gap in the wiring layer below the plurality of holes,
wherein an opening width of the air gap is greater than an opening width of a hole of the plurality of holes;
forming a second film on an inner peripheral surface of the air gap; and
burying the second film in the plurality of holes.

11. The method according to claim 10, wherein
the first film in which the plurality largo number of holes is formed is used as a mask, and
the method further comprises performing etching on an insulating film of the wiring layer to form the air gap in the insulating film below the plurality of holes.

12. The method according to claim 11, further comprising:
performing etching on the insulating film to form a groove having an opening width same as the opening width of the hole of the plurality of holes, with the first film having the plurality of holes being used as the mask; and
performing etching on the insulating film in a width direction of the groove, to make the opening width of the air gap greater than the opening width of the hole of the plurality of holes.

13. An electronic apparatus, comprising:
a semiconductor device including:
a first wiring layer and a second wiring layer,
wherein each of the first wiring layer and the second wiring layer includes a metallic film; and
a diffusion preventing film configured to prevent that prevents diffusion of the metallic film, wherein
the diffusion preventing film is between the first wiring layer and the second wiring layer,
the diffusion preventing film includes:
a first film that includes a plurality of holes, and
a second film in the plurality of holes in the first film,
at least the first wiring layer further includes an air gap and a protective film on an inner peripheral surface of the air gap, and
an opening width of the air gap is one of equal to an opening width of a hole of the plurality of holes in the first film or greater than the opening width of the hole of the plurality of holes.

* * * * *